United States Patent
Inoue et al.

(10) Patent No.: US 11,293,888 B2
(45) Date of Patent: Apr. 5, 2022

(54) SENSOR

(71) Applicant: MINEBEA MITSUMI Inc., Nagano (JP)

(72) Inventors: Fumihiro Inoue, Tokyo (JP); Taketomo Nakane, Tokyo (JP)

(73) Assignee: MINEBEA MITSUMI Inc., Nagano (JP)

(*) Notice: Subject to any disclaimer, the term of this patent is extended or adjusted under 35 U.S.C. 154(b) by 63 days.

(21) Appl. No.: 16/680,951

(22) Filed: Nov. 12, 2019

(65) Prior Publication Data

US 2020/0158675 A1 May 21, 2020

(30) Foreign Application Priority Data

Nov. 16, 2018 (JP) .............................. JP2018-215755

(51) Int. Cl.
*G01R 31/00* (2006.01)
*G01N 27/22* (2006.01)

(52) U.S. Cl.
CPC ......... *G01N 27/223* (2013.01); *G01N 27/226* (2013.01); *G01N 27/228* (2013.01)

(58) Field of Classification Search
USPC .................................................. 324/658–690
See application file for complete search history.

(56) References Cited

U.S. PATENT DOCUMENTS

| | | | |
|---|---|---|---|
| 6,438,257 B1* | 8/2002 | Morimura | G01R 27/2605 382/108 |
| 6,580,600 B2* | 6/2003 | Toyoda | G01N 27/225 361/523 |
| 9,239,308 B2 | 1/2016 | Tondokoro et al. | |
| 9,658,270 B2 | 5/2017 | Watanabe et al. | |
| 2019/0086354 A1* | 3/2019 | Yoo | G01N 27/221 |
| 2020/0033285 A1* | 1/2020 | Nakane | G01N 27/223 |

FOREIGN PATENT DOCUMENTS

| | | |
|---|---|---|
| JP | 5547296 | 7/2014 |
| JP | 6228865 | 11/2017 |

* cited by examiner

*Primary Examiner* — Vincent Q Nguyen
(74) *Attorney, Agent, or Firm* — IPUSA, PLLC

(57) ABSTRACT

A sensor includes a substrate, a reference electrode provided above the substrate, a lower electrode provided above the reference electrode via an insulating film, and an upper electrode provided above the lower electrode via a physical quantity detecting film. The upper electrode and the lower electrode form a parallel-plate-type detection capacitor, and the lower electrode and the reference electrode form a parallel-plate-type reference capacitor.

16 Claims, 20 Drawing Sheets

SENSOR

CROSS-REFERENCE TO RELATED APPLICATIONS

This application is based on and claims priority to Japanese Patent Application No. 2018-215755, filed on Nov. 16, 2018, the entire contents of which are incorporated herein by reference.

BACKGROUND OF THE INVENTION

1. Field of the Invention

The disclosures herein relate to a sensor such as a humidity sensor.

2. Description of the Related Art

As a humidity sensor, an electrostatic-capacitance-type humidity sensor is known, in which a humidity sensing film, formed of a polymeric material whose dielectric constant varies depending on the amount of absorbed moisture, is used as a dielectric substance. In the electrostatic-capacitance-type humidity sensor, the humidity sensing film is disposed between electrodes, and the humidity (relative humidity) is determined by measuring the electrostatic capacitance between the electrodes (see Patent Document 1, for example).

The humidity sensor described in Patent Document 1 includes a sensor unit whose electrostatic capacitance changes in response to humidity, and a reference unit whose electrostatic capacitance remains constant regardless of humidity. The humidity sensor converts the difference in capacitance between the sensor unit and the reference unit into a voltage to measure the temperature. The sensor unit and the reference unit are arranged alongside each other on a substrate.

For use in such an electrostatic-capacitance-type humidity sensor, a circuit including a charge amplifier is known (see Patent Document 2, for example). The charge amplifier converts electric charge, output from a sensor unit, into a voltage. In addition to the charge amplifier, the circuit further includes driving circuits that drive the sensor unit by applying square wave AC drive signals.

In the humidity sensor described in Patent Document 1, the sensor unit and the reference unit are arranged alongside each other on the substrate. Therefore, it is difficult to reduce the size of the sensor unit.

Further, the sensor unit and the reference unit are parallel-plate capacitors in which upper and lower electrodes are included, and the lower electrode is shared by the sensor unit and the reference unit. The lower electrode functions as a capacitance detecting electrode that detects the above-described difference in capacitance. In Patent Document 1, the capacitance detecting electrode is disposed on the substrate. As a result, parasitic capacitance between the capacitance detecting electrode and the substrate becomes large, thus resulting in increased power consumption.

RELATED-ART DOCUMENTS

Patent Documents

Patent Document 1: Japanese Patent No. 5547296
Patent Document 2: Japanese Patent No. 6228865

SUMMARY OF THE INVENTION

It is a general object of the present invention to provide a sensor having a reduced size and reduced power consumption.

According to at least one embodiment, a sensor includes a substrate, a reference electrode provided above the substrate, a lower electrode provided above the reference electrode via an insulating film, and an upper electrode provided above the lower electrode via a physical quantity detecting film. The upper electrode and the lower electrode form a parallel-plate-type detection capacitor, and the lower electrode and the reference electrode form a parallel-plate-type reference capacitor.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1A:
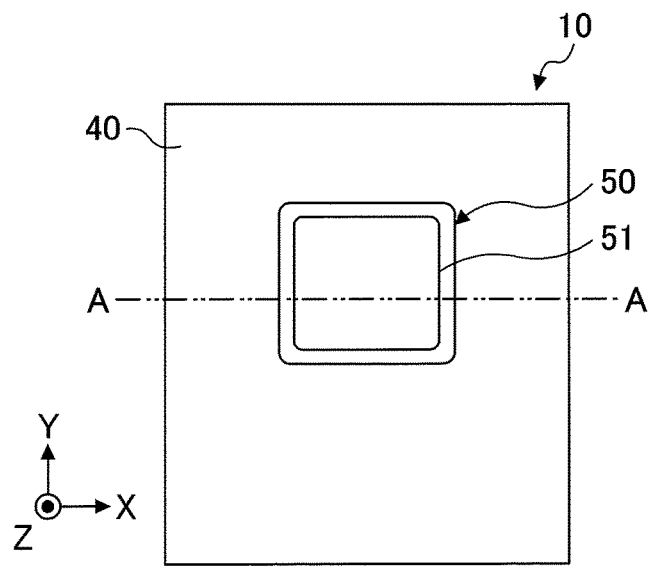
FIG. 1A through FIG. 1C are diagrams illustrating a schematic configuration of a humidity sensor according to an embodiment of the present invention.

According to an embodiment of the present invention, a sensor having a reduced size and reduced power consumption is provided.

In the following, embodiments of the present invention will be described with reference to the accompanying drawings. In the drawings, the same elements are denoted by the same reference numerals, and a duplicate description thereof may be omitted. As used herein, "humidity" refers to "relative humidity".

[Schematic Configuration]

A humidity sensor 10 according to an embodiment of the present invention will be described.

Figure 1C:
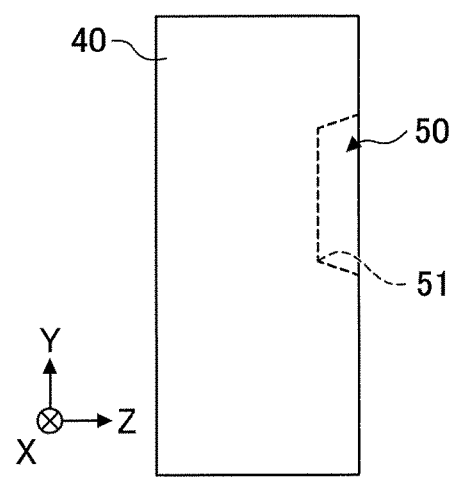
Figure 1B:
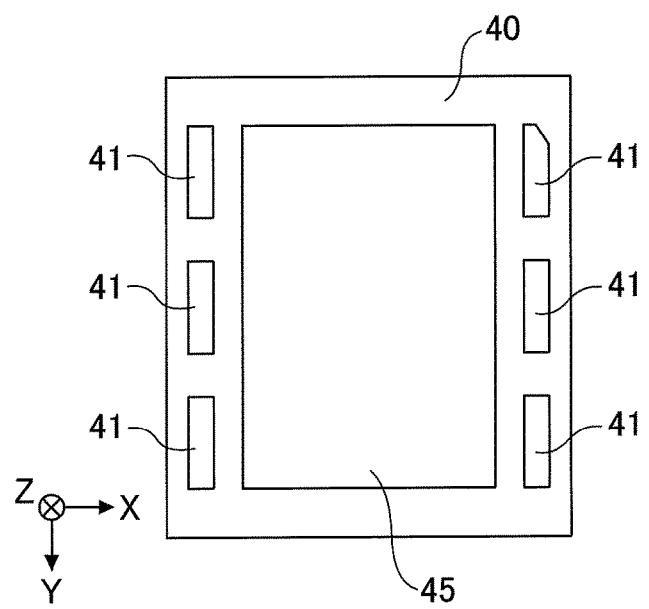
Figure 2:
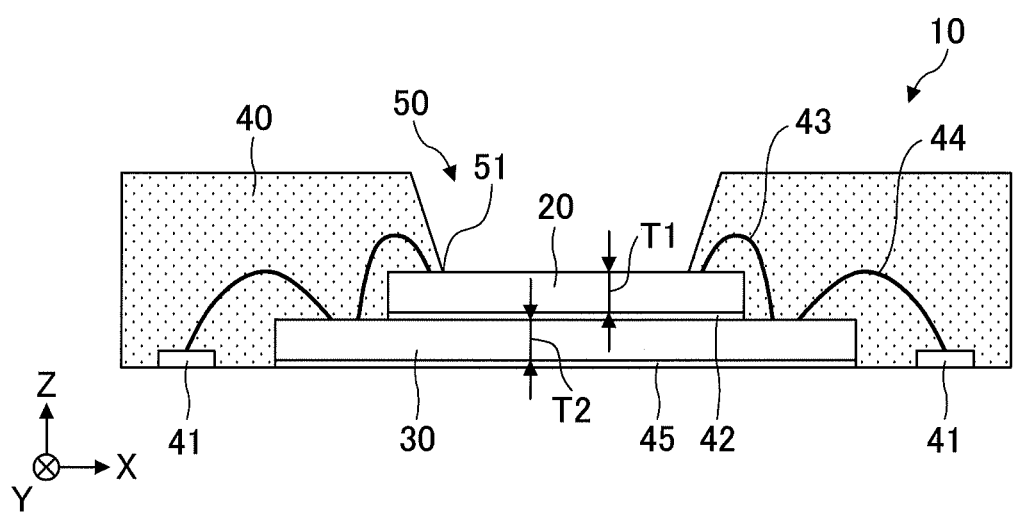
FIG. 2 is a schematic cross-sectional view of the humidity sensor taken through line A-A of FIG. 1.

FIG. 1A through FIG. 1C are diagrams illustrating a schematic configuration of the humidity sensor 10 according to the embodiment of the present invention. FIG. 1A is a plan view from above the humidity sensor 10. FIG. 1B is a bottom view from below the humidity sensor 10. FIG. 1C is a side view from the side of the humidity sensor 10. Further, FIG. 2 is a schematic cross-sectional view of the humidity sensor 10 taken through line A-A of FIG. 1A.

The humidity sensor 10 has an approximate rectangular shape in planar view. The X-direction and the Y-direction are perpendicular to each other. The humidity sensor 10 has a thickness in the Z-direction that is perpendicular to both the X-direction and the Y-direction. The shape of the humidity sensor 10 in planar view is not limited to the rectangular shape, and may a circular shape, an oval shape, or a polygonal shape.

The humidity sensor 10 includes a sensor chip 20, which is an example of a first semiconductor chip, an application-specific integrated circuit (ASIC) chip 30, which is an example of a second semiconductor chip, a molded resin 40, and a plurality of lead terminals 41.

The sensor chip 20 is stacked on the ASIC chip 30 via a first die attach film (DAF) 42. In other words, the sensor chip 20 and the ASIC chip 30 have a stacked structure.

The sensor chip 20 and the ASIC chip 30 are electrically connected via a plurality of first bonding wires 43. The ASIC chip 30 and the plurality of leads 41 are electrically connected via a plurality of second bonding wires 44.

The sensor chip 20 and the ASIC chip 30 stacked as descried above, the plurality of first bonding wires 43, the plurality of second bonding wires 44, and the plurality of lead terminals 41 are sealed by the molded resin 40 to form a package. Such a packaging technique is referred to as a plating lead package (PLP) method.

In the PLP method, a thickness T1 of the sensor chip 20 and a thickness T2 of the ASIC chip 30 are preferably 200 µm or more.

As will be described in more detail below, a second DAF 45, used to form the package with the PLP method, remains on the lower surface of the ASIC chip 30. The second DAF 45 functions to electrically insulate the lower surface of the ASIC chip 30. The second DAF 45 and the plurality of lead terminals 41 are exposed on the lower surface of the humidity sensor 10.

Each of the lead terminals 41 is formed of nickel or copper, for example. The first DAF 42 and the second DAF 45 are each formed of an insulating material that is a mixture of epoxy, silicon, silica, and the like. The molded resin 40 is a black resin, such as an epoxy resin, having light-blocking properties.

An opening 50 is formed on the upper surface side of the humidity sensor 10, and a part of the sensor chip 20 is exposed from the molded resin 40 through the opening 50. For example, the opening 50 may have a tapered wall, such that the area of the opening decreases toward the lower surface of the humidity sensor 10. The lowermost part of the opening 50, from which the sensor chip 20 is exposed, is referred to as an effective opening 51.

Figure 3:
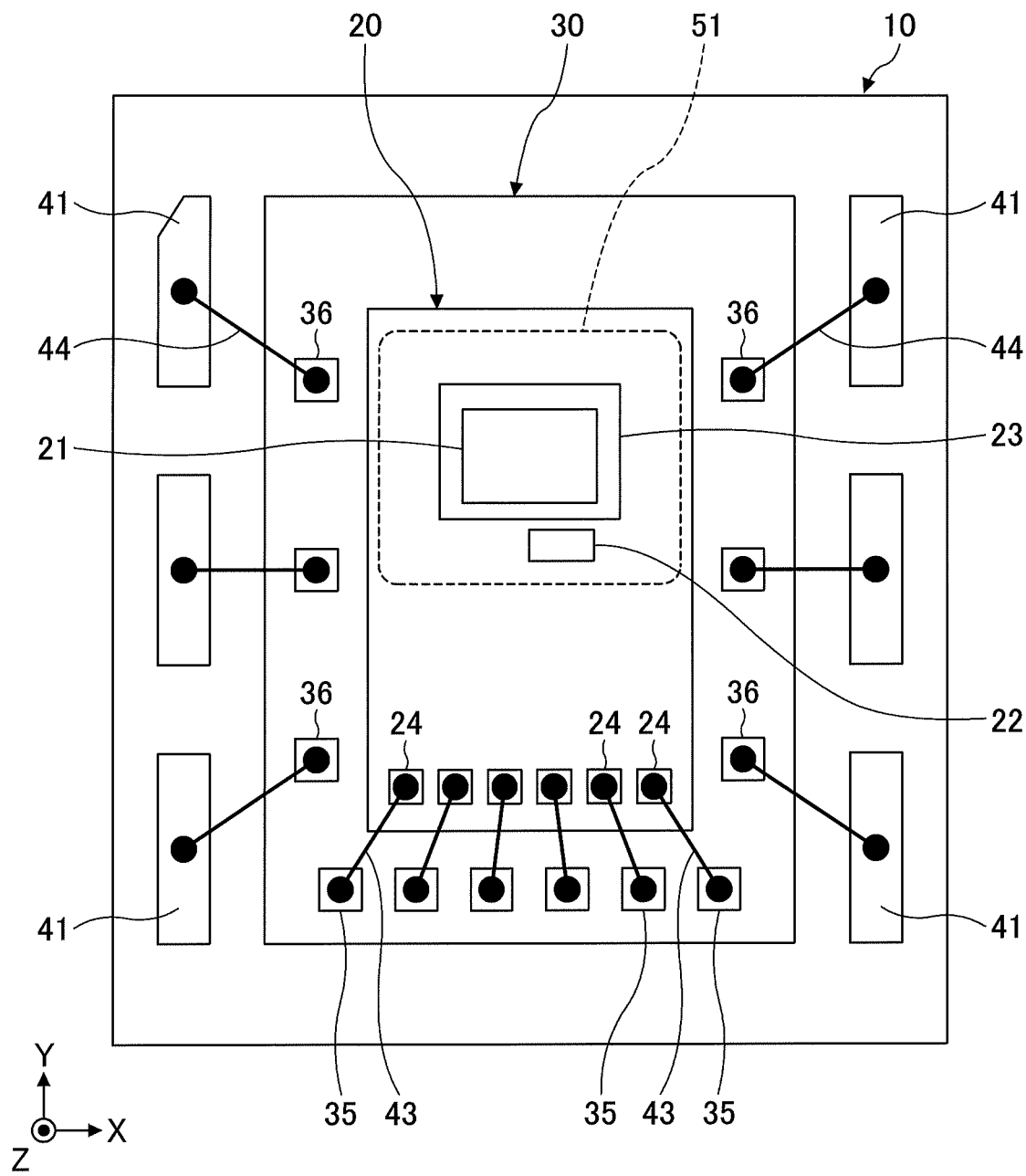
FIG. 3 is a plan view of the humidity sensor in which a molded resin is not depicted.

FIG. 3 is a plan view of the humidity sensor 10 in which the molded resin 40 is not depicted. As illustrated in FIG. 3, the sensor chip 20 and the ASIC chip 30 each have an approximately rectangular shape in planar view. The sensor chip 20 is smaller than the ASIC chip 30, and the sensor chip 20 is stacked on the surface of the ASIC chip 30 via the first DAF 42.

The sensor chip 20 includes a humidity detecting unit 21, a temperature detecting unit 22, and a heating unit 23 within the effective opening 51. The heating unit 23 is disposed on the lower surface of the humidity detecting unit 21 to cover a region where the humidity detecting unit 21 is formed.

In addition, a plurality of bonding pads (hereinafter simply referred to as "pads") 24 are formed at the end portion of the sensor chip 20. In the present embodiment, six pads 24 are formed. The pads 24 may be formed of aluminum or an aluminum silicon (AlSi) alloy, for example.

Figure 14:
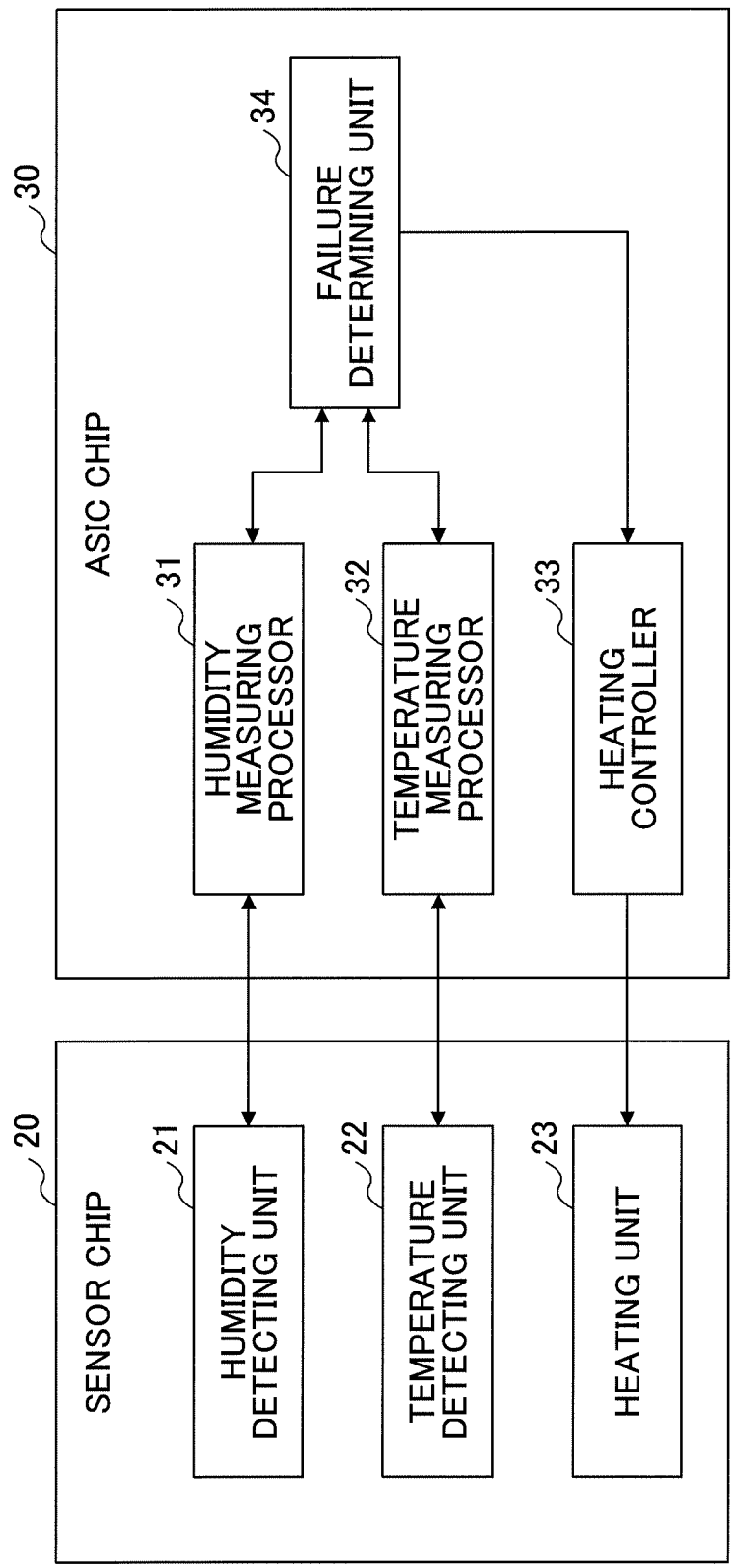
FIG. 14 is a block diagram illustrating a configuration of an ASIC chip.

The ASIC chip 30 is a semiconductor chip for signal processing and control. As illustrated in FIG. 14, the ASIC chip 30 includes a humidity measuring processor 31, a temperature measuring processor 32, a heating controller 33, and a failure determining unit 34, which will be described below.

Further, a plurality of first pads 35 and a plurality of second pads 36 are provided in an area on the surface of the ASIC chip 30 that is not covered by the sensor chip 20. The first pads 35 and the second pads 36 may be formed of aluminum or an aluminum silicon (AlSi) alloy, for example.

The first pads 35 are connected to the respective pads 24 of the sensor chip 20 via the first bonding wires 43. The second pads 36 are connected to the respective lead terminals 41 via the second bonding wires 44. The lead terminals 41 are disposed at the periphery of the ASIC chip 30.

[Configuration of Sensor Chip]

Next, a configuration of the sensor chip 20 will be described.

Figure 4:
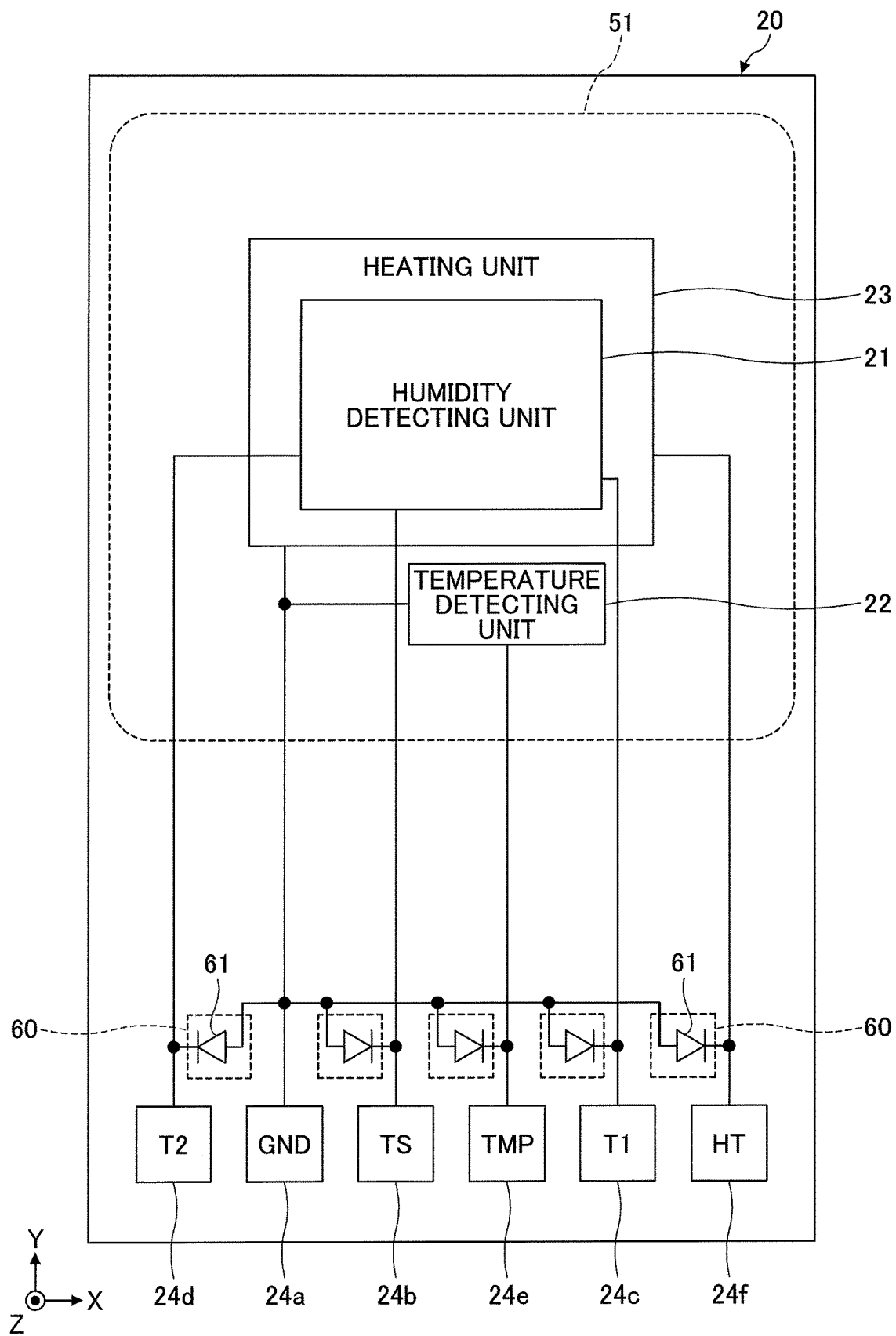
FIG. 4 is a plan view schematically illustrating a configuration of a sensor chip.

FIG. 4 is a plan view schematically illustrating the configuration of the sensor chip 20. The above-described pads 24 are terminals that may be used to apply voltages from the outside and detect potentials. In FIG. 4, the plurality of pads 24 are distinguishably illustrated as pads 24a through 24f. If the pads 24a through 24f are not required to be distinguished, the pads 24a through 24f are simply referred to as "pads 24".

The pad 24a functions as a ground electrode terminal (GND) grounded to the ground potential. The pad 24a is electrically connected to various units such as the temperature detecting unit 22 and the heating unit 23 via wiring and a substrate. Further, the pad 24a is electrically connected to a p-type semiconductor substrate 70 (see FIG. 9) constituting the sensor chip 20.

The pad 24b is a signal terminal (TS) electrically connected to a lower electrode 83 of the humidity detecting unit 21. The pad 24c is a first driving terminal (T1) electrically connected to an upper electrode 84 of the humidity detecting unit 21. The pad 24d is a second driving terminal (T2) electrically connected to a reference electrode 82 (see FIG. 9) of the humidity detecting unit 21. The lower electrode 83 functions as a capacitance detecting electrode used by the charge amplifier 301 (see FIG. 15) to detect an electrostatic capacitance.

The pad 24e is a temperature detecting terminal (TMP) electrically connected to the temperature detecting unit 22. The pad 24e is used to obtain a temperature detection signal. The pad 24f is a heating terminal (HT) electrically connected to the heating unit 23. The pad 24f is used to supply a driving voltage that drives the heating unit 23.

Further, electrostatic discharge (ESD) protection circuits 60 are connected to the respective pads 24b through 24f, except for the pad 24a. Each of the ESD protection circuits 60 is electrically connected between the pad 24a and a corresponding pad of the pads 24b through 24f. The pad 24a functions as the ground electrode terminal and the pads 24b through 24f are used as input terminals or output terminals. In the present embodiment, each of the ESD protection circuits 60 includes one diode 61. The anode side of the diode 61 is connected to the pad 24a, and the cathode side of the diode 61 is connected to a corresponding pad of the pads 24b through 24f.

The ESD protection circuits 60 are preferably arranged near the pads 24b through 24f, so as to be separated as much as possible from the effective opening 51. Because the ESD protection circuits 60 are covered by the molded resin 40, an unnecessary electric current produced by a photoelectric effect does not flow in the ESD protection circuits 60.

[Configuration of ESD Protection Circuit]

Next, a configuration of an ESD protection circuit 60 will be described.

Figure 5:
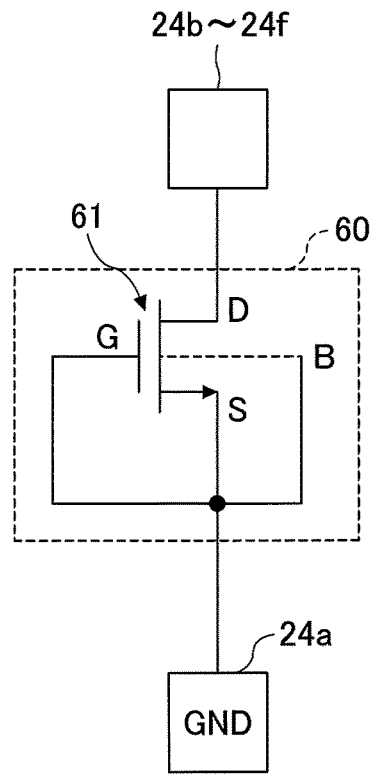
FIG. 5 is a circuit diagram illustrating a configuration of an ESD protection circuit.

FIG. 5 is a circuit diagram illustrating the configuration of the ESD protection circuit 60. As illustrated in FIG. 5, a diode 61 of the ESD protection circuit 60 is formed by an N-channel metal-oxide-semiconductor (MOS) transistor (hereinafter referred to as an NMOS transistor). More specifically, the diode 61 is formed by the NMOS transistor having a source, a gate, and a back gate that are short-circuited. The short-circuited part of the NMOS transistor functions as an anode of the diode 61, and a drain of the NMOS transistor functions as a cathode of the diode 61.

Figure 6:
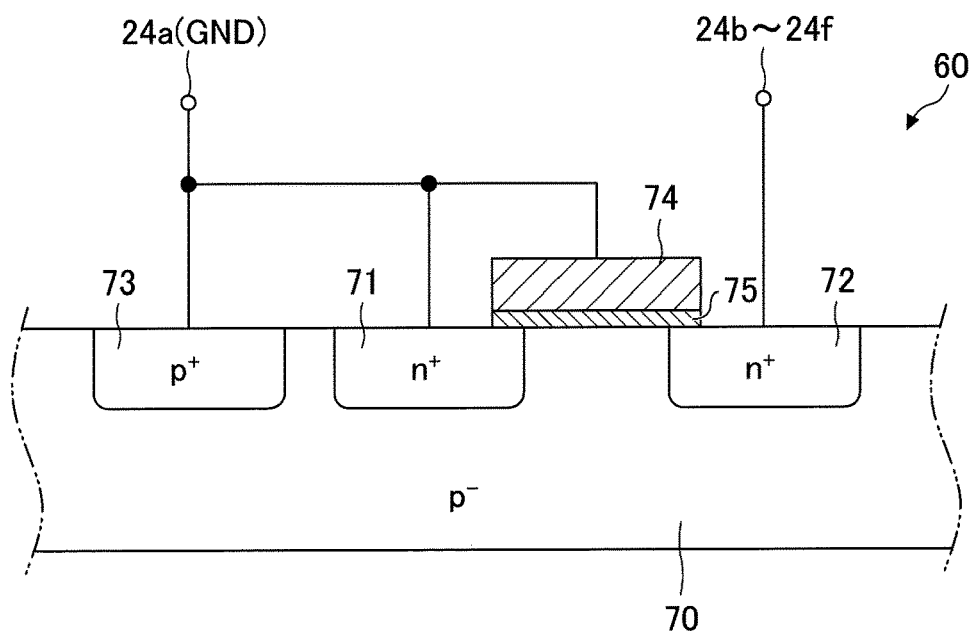
FIG. 6 is a diagram illustrating a layer structure of an NMOS transistor forming the ESD protection circuit.

FIG. 6 is a diagram illustrating a layer structure of the NMOS transistor forming the ESD protection circuit 60. The NMOS transistor illustrated in FIG. 6 includes a p-type semiconductor substrate 70, two n-type diffusion layers 71 and 72 formed in the surface layer of the p-type semiconductor substrate 70, a contact layer 73, and a gate electrode 74. The gate electrode 74 is formed on the surface of the p-type semiconductor substrate 70 via a gate insulating layer 75. The gate electrode 74 is disposed between the two n-type diffusion layers 71 and 72.

For example, the n-type diffusion layer 71 functions as the source, and the n-type diffusion layer 72 functions as the drain. The contact layer 73 is a low-resistance layer (p-type diffusion layer) for making an electrical connection to the p-type semiconductor substrate 70, which functions as the back gate. The n-type diffusion layer 71, the gate electrode 74, and the contact layer 73 are connected in common and short-circuited. The short-circuited part functions as the anode, and the n-type diffusion layer 72 functions as the cathode.

The p-type semiconductor substrate 70 may be a p-type silicon substrate. The gate electrode 74 may be formed of polycrystalline silicon (polysilicon). The gate insulating layer 75 may be formed of an oxide film such as silicon dioxide.

[Configuration of Humidity Detecting Unit]

Next, a configuration of the humidity detecting unit 21 will be described.

Figure 7:
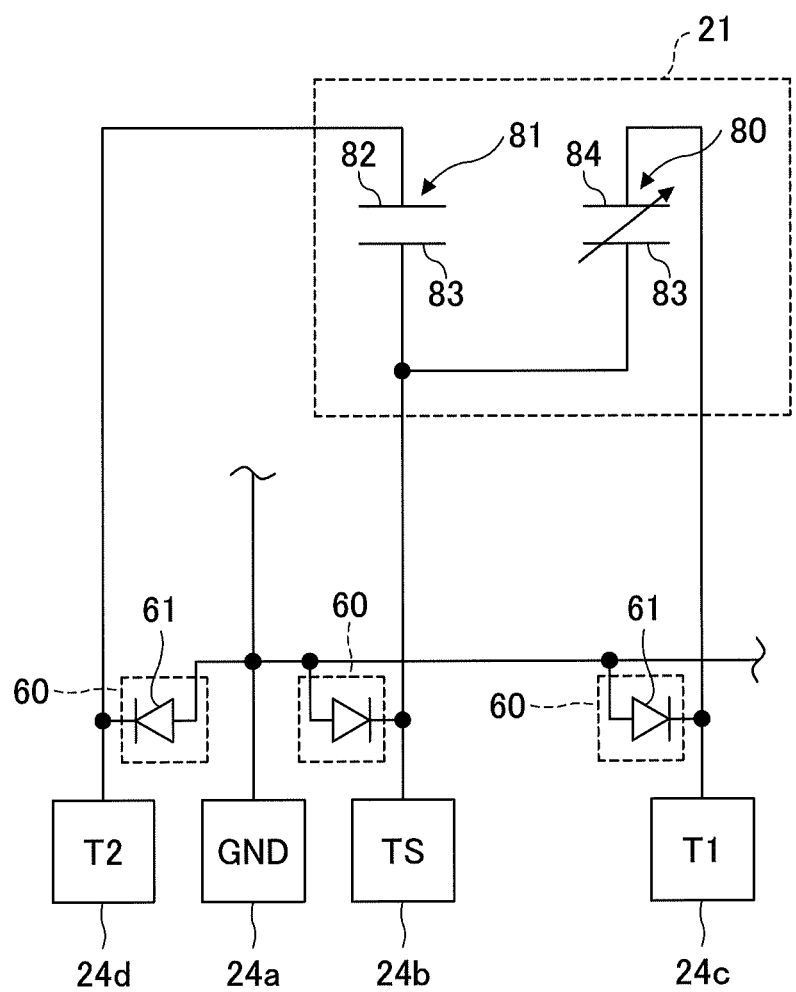
FIG. 7 is a circuit diagram illustrating a configuration of a humidity detecting unit.

FIG. 7 is a circuit diagram illustrating the configuration of the humidity detecting unit 21. As illustrated in FIG. 7, the humidity detecting unit 21 includes a parallel-plate-type humidity detecting capacitor 80 and a parallel-plate-type reference capacitor 81.

In the humidity detecting unit 21, one electrode of the humidity detecting capacitor 80 is the lower electrode 83 that is electrically connected to the pad 24b (signal terminal TS). The other electrode of the humidity detecting capacitor 80 is the upper electrode 84 that is electrically connected to the pad 24c (first driving terminal T1) One electrode of the reference capacitor 81 is the lower electrode 83 that is used in common between the humidity detecting capacitor 80 and the reference capacitor 81. The other electrode of the reference capacitor 81 is the reference electrode 82 that is electrically connected to the pad 24d (second driving terminal T2).

A humidity sensing film 86, which will be described below, is provided between the electrodes of the humidity detecting capacitor 80. The humidity sensing film 86 is formed of a polymeric material such as polyimide that adsorbs moisture in the air and whose dielectric constant varies in accordance with the amount of adsorbed moisture. Accordingly, the electrostatic capacitance of the humidity detecting capacitor 80 varies in accordance with the amount of moisture adsorbed by the humidity sensing film 86.

A second insulating film 111 (see FIG. 9), which will be described below, is provided between the electrodes of the reference capacitor 81. The second insulating film 111 is formed of an insulating material such as silicon dioxide (SiO2) that does not adsorb moisture. Accordingly, the electrostatic capacitance of the reference capacitor 81 does not vary. As used herein, the expression "electrostatic capacitance does not vary" includes "electrostatic capacitance varies slightly".

The amount of moisture included in the humidity sensing film 86 corresponds to ambient humidity of the humidity sensor 10. Thus, relative humidity can be measured by detecting a difference in electrostatic capacitance between the humidity detecting capacitor 80 and the reference capacitor 81. The measurement of relative humidity is performed by the humidity measuring processor 31 (see FIG. 14) included in the ASIC chip 30.

[Configuration of Temperature Detecting Unit]

Next, a configuration of the temperature detecting unit 22 will be described.

Figure 8:
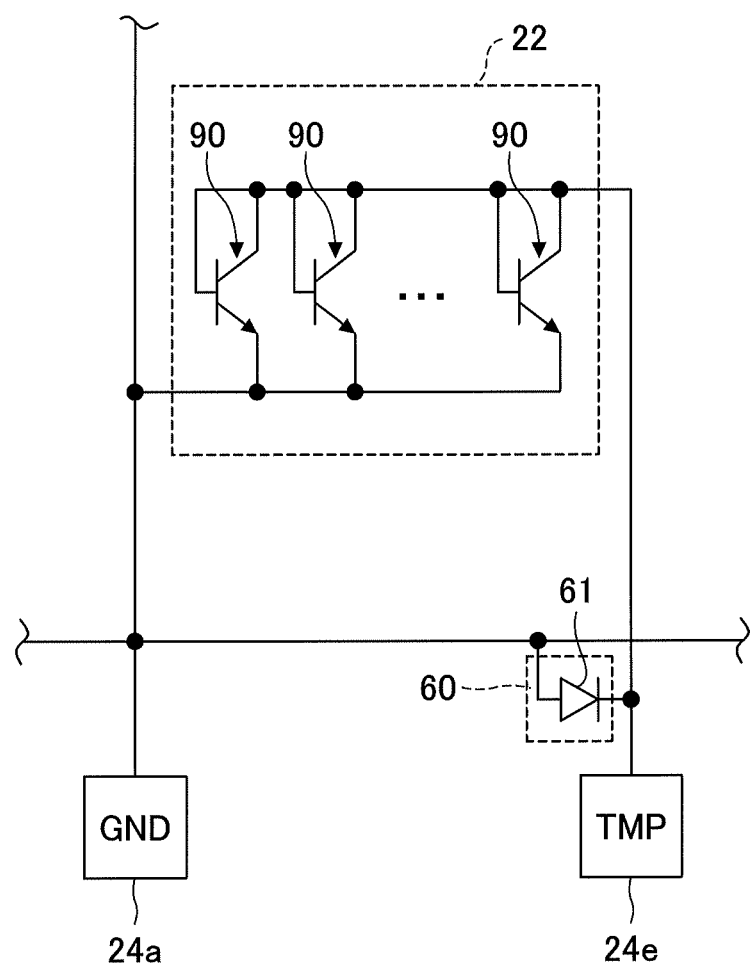
FIG. 8 is a circuit diagram illustrating a configuration of a temperature detecting unit.

FIG. 8 is a circuit diagram illustrating the configuration of the temperature detecting unit 22. The temperature detecting unit 22 is a band-gap type temperature sensor that detects the temperature by utilizing the electrical property (band cap) of the semiconductor that varies in proportion to a temperature change. For example, the temperature detecting unit 22 includes one or more of bipolar transistors, in each of which two terminals of a base, an emitter, and a collector are connected. The temperature detecting unit 22 measures the temperature by detecting a voltage value between the two terminals.

As illustrated in FIG. 8, in the present embodiment, the temperature detecting unit 22 includes a plurality of (for example, eight) npn type bipolar transistors 90 connected in parallel. In each of the bipolar transistors 90, a base and a collector are connected to each other. By connecting the plurality of bipolar transistors 90 in parallel, a junction area of a p-n junction can be increased, and the ESD resistance can be thus improved.

An emitter of a bipolar transistor 90 is electrically connected to the pad 24a, which functions as the ground electrode terminal. The base and the collector of the bipolar transistor 90 are connected to the pad 24e, which functions as the temperature detecting terminal.

The temperature is measured by the temperature measuring processor 32 (see FIG. 14) included in the ASIC chip 30, based on the potential of the pad 24e.

[Device Structure of Sensor Chip]

Next, a device structure of the sensor chip 20 will be described.

Figure 9:
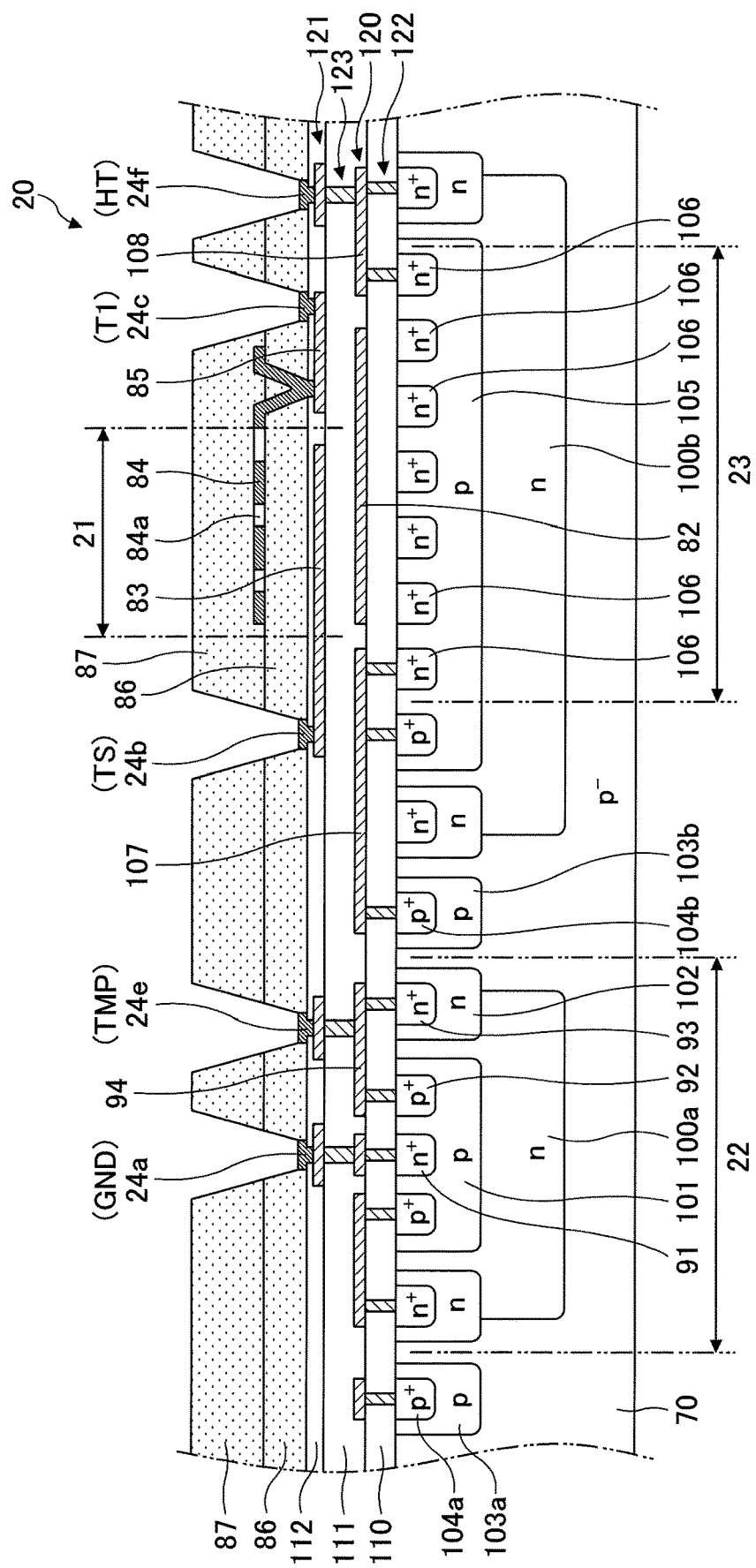
FIG. 9 is a schematic cross-sectional view of a device structure of a sensor chip.

FIG. 9 is a schematic cross-sectional view of the device structure of the sensor chip 20. In order to facilitate understanding of the structure, the pads 24a, 24b, 24c, and 24e are drawn in the same cross section as the humidity detecting unit 21, the temperature detecting unit 22, and the heating unit 23 in FIG. 9; however, this does not mean that the pads 24 are actually located in the same cross section as the humidity detecting unit 21, the temperature detecting unit 22, and the heating unit 23. Further, in order to facilitate the understanding of the structure, the humidity detecting unit 21, the temperature detecting unit 22, and the heating unit 23 are simplified, and the positional relationship of the units illustrated in FIG. 9 is different from the actual positional relationship.

As illustrated in FIG. 9, the sensor chip 20 includes the above-described p-type semiconductor substrate 70. A first deep n-well 100a and a second deep n-well 100b are formed in the p-type semiconductor substrate 70. The temperature detecting unit 22 is formed in the first deep n-well 100a, and the heating unit 23 is formed in the second deep n-well 100b.

P-wells 103a and 103b are formed in the surface layer of the p-type semiconductor substrate 70 where neither the first deep n-well 100a nor the second deep n-well 100b is formed. Contact layers 104a and 104b, which are p-type diffusion regions, are formed in the surface layers of the p-wells 103a and 103b, respectively. The contact layers 104a and 104b are low-resistance layers (p-type diffusion layers) for making an electrical connection between the p-type semiconductor substrate 70 and predetermined wiring layers formed on the p-type semiconductor substrate 70.

A p-well 101 and an n-well 102 are formed in the surface layer of the first deep n-well 100a. An n-type diffusion layer 91 and a p-type diffusion layer 92 are formed in the surface layer of the p-well 101. An n-type diffusion layer 93 is formed in the surface layer of the n-well 102. The n-type diffusion layer 91, the p-type diffusion layer 92, and the n-type diffusion layer 93 form the above-described npn-type bipolar transistor 90, and function as an emitter, a base, and a collector, respectively.

A p-well 105 is formed in the surface layer of the second deep n-well 100b. One or more n-type diffusion layers 106 are formed in the surface layer of the p-well 105. In the present embodiment, a plurality of n-type diffusion layers 106 are formed. For example, each of the n-type diffusion layers 106 extends in a direction perpendicular to the paper surface of FIG. 9, and forms a one-dimensional lattice as a whole (see FIG. 11). Each of the n-type diffusion layers 106 has a predetermined resistance (for example, a sheet resistance of approximately 3.3Ω), and functions as a resistor that generates heat when a current flows through the resistor. In other words, the n-type diffusion layers 106 form the above-described heating unit 23.

Each layer of the p-type semiconductor substrate 70 is formed by an existing semiconductor manufacturing process (a CMOS process). Accordingly, the n-type diffusion layers 106, which function as the resistors, are formed by the same manufacturing process as the n-type diffusion layers 91 and 93, included in a part of the temperature detecting unit 22. The n-type diffusion layers 106, 91, and 93 are formed simultaneously by an ion implantation process in which n-type impurities (such as phosphorus) are implanted into the p-type semiconductor substrate 70. In other words, the n-type diffusion layers 106, functioning as the resistors, and the n-type diffusion layers 91 and 93, included in the part of the temperature detecting unit 22, have the same depth from the surface of the p-type semiconductor substrate 70. In addition, the n-type diffusion layers 106 and the p-type diffusion layer 92 included in a part of the temperature detecting unit 22 may have the same depth from the surface of the p-type semiconductor substrate 70.

Further, instead of the ion implantation process, the n-type diffusion layers 106, 91, and 93 may also be formed by a thermal diffusion process in which impurities are added to the p-type semiconductor substrate 70 by applying thermal processing.

In addition, the above-described n-type diffusion layers 71 and 72 of the ESD protection circuit 60 may also be formed by the same manufacturing process (ion implantation process or thermal diffusion process) as the n-type diffusion layers 106, 91, and 93. The contact layer 73 is formed by the same manufacturing process (ion implantation process or thermal diffusion process) as the p-type diffusion layer 92 and the contact layers 104a and 104b.

Other layers of the p-type semiconductor substrate 70 mainly function as contact layers, and thus a description thereof will be omitted.

A first insulating film 110, the second insulating film 111, and a third insulating layer 112 are stacked in this order on the surface of the p-type semiconductor substrate 70. The insulating films 110, 111, and 112 are formed of an insulating material such as silicon dioxide ($SiO_2$) or silicon nitride (SiN).

A first wiring layer 120 is formed on the first insulating film 110. A second wiring layer 121 is formed on the second insulating film 111. The second insulating film 111 covers the first wiring layer 120. The third insulating film 112 covers the second wiring layer 121. The first wiring layer 120 and the second wiring layer 121 are formed of an electrically conductive material such as aluminum.

A first plug layer 122, having a plurality of first plugs for electrically connecting the first wiring layer 120 to the p-type semiconductor substrate 70, is formed in the first insulating film 110. A second plug layer 123, having a plurality of second plugs for electrically connecting the first wiring layer 120 to the second wiring layer 121, is formed in the second insulating film 111. The first plug layer 122 and the second plug layer 123 are formed of an electrically conductive material such as tungsten.

For example, wiring 94 for connecting the base to the collector of the above-described bipolar transistor 90 is formed by the first wiring layer 120, and is electrically connected to the p-type diffusion layer 92 and the n-type diffusion layer 93 via the first plug layer 122. In addition, the wiring 94 is electrically connected to the pad 24e, which functions as the temperature detecting terminal, via the second plug layer 123 and the second wiring layer 121. Further, the n-type diffusion layer 91, which functions as the emitter of the bipolar transistor 90, is electrically connected to the pad 24a, which functions as the ground electrode terminal, via the first plug layer 122, the first wiring layer 120, and the second wiring layer 121.

Wiring 107 for grounding one end of the heating unit 23 to the ground potential is formed by the first wiring layer 120, and is electrically connected to an n-type diffusion layer 106 and a contact layer 104b via the first plug layer 122. In the following, the wiring 107 is referred to as a ground wiring 107.

In addition, wiring 108 for electrically connecting the other end of the heating unit 23 to the pad 24f, which functions as the heating terminal, is electrically connected to an n-type diffusion layer 106 via the first plug layer 122, and is electrically connected to the pad 24f via the second plug layer 123 and the second wiring layer 121. The wiring 108 is preferably wider than other signal wiring, in order to prevent electromigration caused by a large current flowing through the heating unit 23. In the following, the wiring 108 is referred to as power supply wiring 108.

The reference electrode 82 of the reference capacitor 81 is formed by the first wiring layer 120, and is electrically connected to the pad 24d (not illustrated in FIG. 9), which functions as the second driving terminal T2, via the second plug layer 123 and the second wiring layer 121.

Further, the lower electrode 83 of the humidity detecting capacitor 80 is formed by the second wiring layer 121, and is electrically connected to the pad 24b, which functions as the signal terminal TS. Moreover, wiring 85 for electrically connecting the upper electrode 84 of the humidity detecting capacitor 80 to the pad 24c, which functions as the first driving terminal T1, is formed by the second wiring layer 121. The lower electrode 83 is formed on the second insulating film 111 on the opposite side of the reference electrode 82.

The pads 24a through 24f are formed on the third insulating layer 112, and are formed of an electrically conductive material such as aluminum (Al). The pads 24a through 24f are electrically connected to the second wiring layer 121 through the third insulating layer 112.

The humidity sensing film 86 is formed on the third insulating film 112. The humidity sensing film 86 may have a thickness of 0.5 μm to 1.5 μm, and is formed of a polymeric material that readily adsorbs water molecules. The humidity sensing film 86 may be a polyimide film having a thickness of 1 μm, for example. The polymeric material forming the humidity sensing film 86 is not limited to polyimide, and may be cellulose, polymethyl methacrylate (PMMA), or polyvinyl alcohol (PVA).

The upper surface of the humidity sensing film 86 is flat, and the plate-shaped upper electrode 84 is formed on the upper surface of the humidity sensing film 86. The upper electrode 84 is formed on the humidity sensing film 86 on the opposite side of the lower electrode 83. A part of the upper electrode 84 is electrically connected to the wiring 85. The upper electrode 84 is an electrically conductive layer made of aluminum and having a thickness of 200 nm, for example. The upper electrode 84 has a plurality of openings 84a that allow water molecules in the air to be efficiently adsorbed into the humidity sensing film 86.

An overcoat layer 87 is formed on the humidity sensing film 86 so as to cover the upper electrode 84. The overcoat layer 87 is made of a polymeric material. For example, the overcoat layer 87 may be made of the same material as the humidity sensing film 86. The overcoat layer 87 may have a thickness of 0.5 μm to 10 μm.

The humidity sensing film 86 and the overcoat layer 87 have openings through which the pads 24a through 24f are exposed.

As described above, the parallel-plate-type humidity detecting capacitor 80 is configured by the lower electrode 83 and the upper electrode 84. In addition, the parallel-plate-type reference capacitor 81 is configured by the lower electrode 83 and the reference electrode 82. Further, the humidity detecting capacitor 80 and the reference capacitor 81 are provided above the heating unit 23.

Accordingly, when the heating unit 23 generates heat, the humidity sensing film 86 between the lower electrode 83 and the upper electrode 84 is heated, and as a result, moisture is evaporated and the amount of moisture contained in the humidity sensing film 86 changes. This causes the dielectric constant of the humidity sensing film 86 to change, and the electrostatic capacitance of the humidity detecting capacitor 80 to change. The temperature detecting unit 22 detects a change in temperature caused by the heating unit 23.

[Shape of Heating Unit in Planar View]

Figure 10:
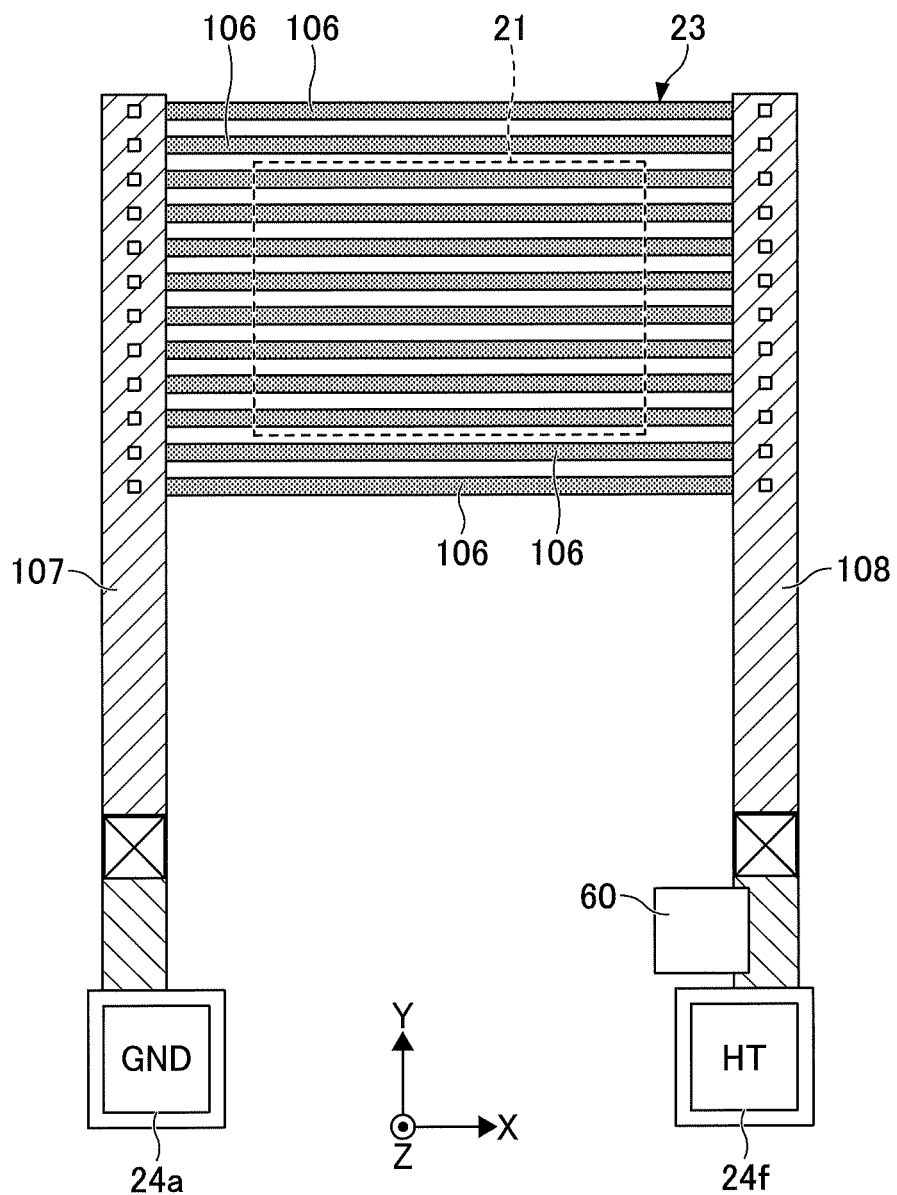
FIG. 10 is a schematic plan view of a heating unit.

FIG. 10 is a schematic plan view of the heating unit 23. In FIG. 10, a schematic wiring layout is depicted, which differs from the actual wiring layout.

As illustrated in FIG. 10, the n-type diffusion layers 106, forming the heating unit 23, has a one-dimensional lattice shape in which a plurality of elongated stripe-shaped regions are arranged in parallel. One ends of the n-type diffusion layers 106 having the one-dimensional lattice shape are connected to the above-described ground wiring 107, and the other ends of the n-type diffusion layers 106 are connected to the above-described power supply wiring 108. The heating unit 23 is located under the humidity detecting unit 21 so as to cover the entire humidity detecting unit 21.

As will be described below, the ground wiring 107 does not actually have a linear shape and has a shape extending in the XY plane, and functions as a shielding layer that shields signal lines.

[Shapes of Electrodes in Planar View]

Figure 11:
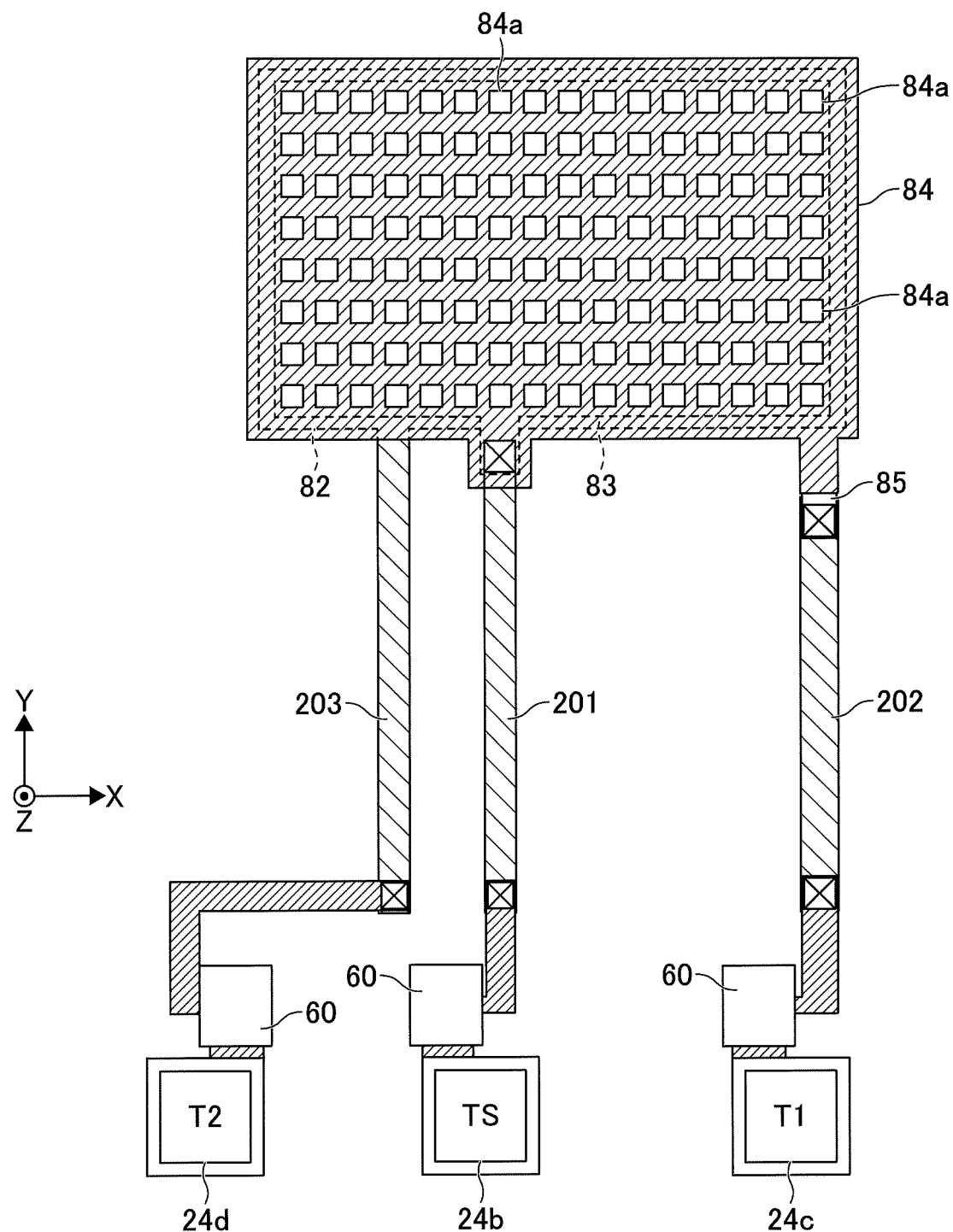
FIG. 11 is a schematic plan view of each electrode of the humidity detecting unit.

FIG. 11 is a schematic plan view of the electrodes of the humidity detecting unit 21.

As illustrated in FIG. 11, the reference electrode 82, the upper electrode 84, and the lower electrode 83 have approximately the same rectangular shape. The upper electrode 84 is disposed to cover the lower electrode 83 and the reference electrode 82. The reference electrode 82, the lower electrode 83, and the upper electrode 84 are stacked in this order above the p-type semiconductor substrate 70.

The reference electrode 82 and the upper electrode 84 preferably have approximately the same size. The lower electrode 83 is preferably smaller than the reference electrode 82 and the upper electrode 84.

The plurality of openings 84a are preferably as small as possible. As the openings 84a become smaller, leakage of an electric field into the air can be decreased, and further, a change in electrostatic capacitance between the lower electrode 83 and the upper electrode 84 can be reduced when a foreign material becomes trapped in the opening (see FIG. 13). In practical use, a large number of minute openings 84a are formed. Note that the shape of the openings 84a is not limited to a square shape. The openings 84a may have an elongated stripe shape or a circular shape.

Signal lines 201 through 203 are wires formed by the first wiring layer 120 and the second wiring layer 121. The signal line 201 is a wire connected between the lower electrode 83 of the humidity detecting unit 21 and the pad 24. The signal line 202 is a wire connected between the upper electrode 84 of the humidity detecting unit 21 and the pad 24c.

The above-described wiring 85 is a part of the signal line 202.

[Shape of Electrode in Planar View]

Figure 12:
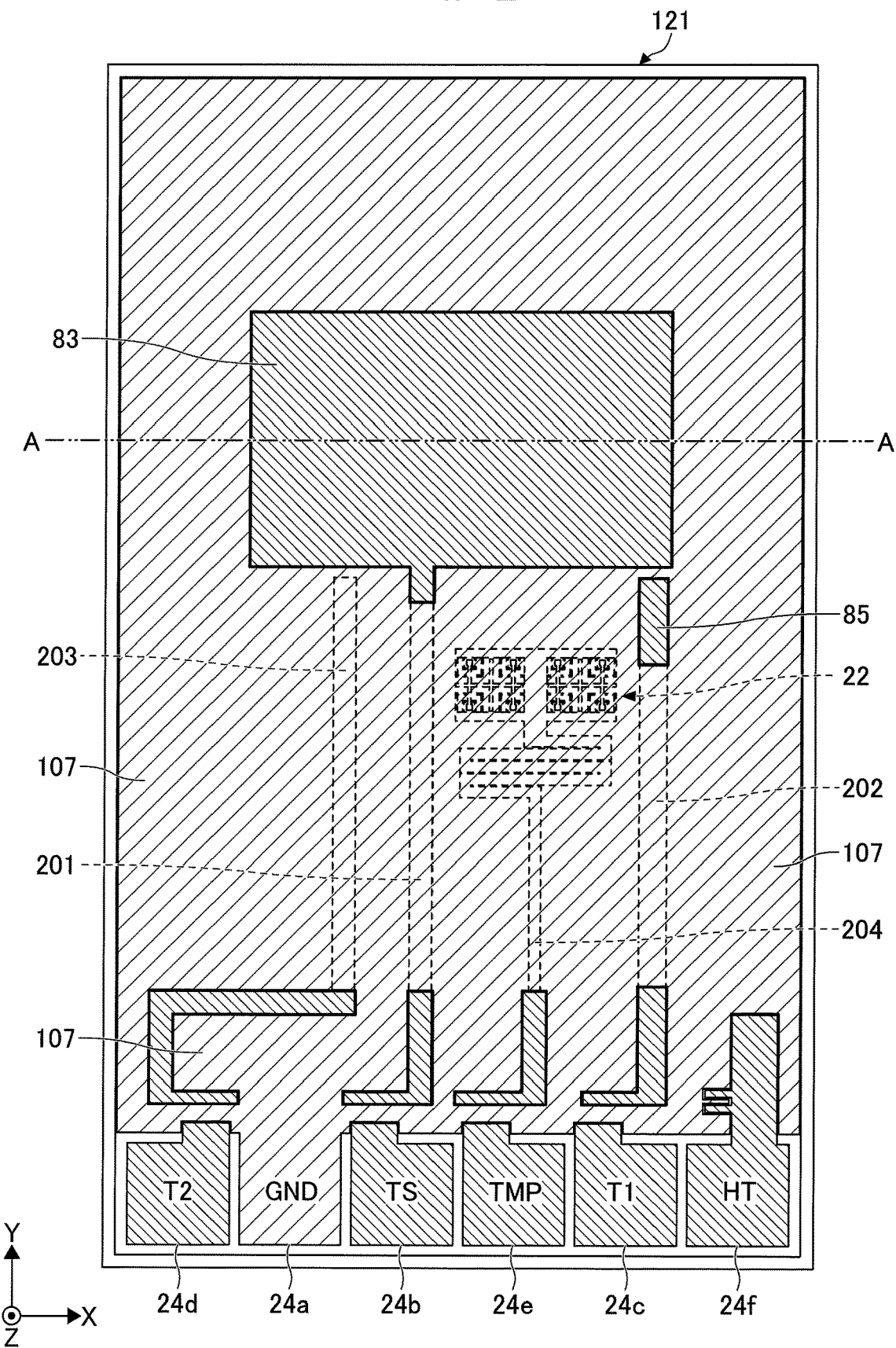
FIG. 12 is a plan view of a layout pattern of a second wiring layer.

FIG. 12 is a plan view of a layout pattern of the second wiring layer 121. As illustrated in FIG. 12, the lower electrode 83, a ground wiring 107, and the wiring 85 are formed by the second wiring layer 121.

The ground wiring 107 is disposed adjacent to wiring such as the lower electrode 83 and the wiring 85 via small slits. The ground wiring 107 is formed in a wide area. Therefore, the ground wiring 107 covers the above-described signal lines 201 through 203 and also covers a signal line 204 connected to the temperature detecting unit 22, and thus functions as the shielding layer.

[Stacked Structure of Electrodes]

Figure 13:
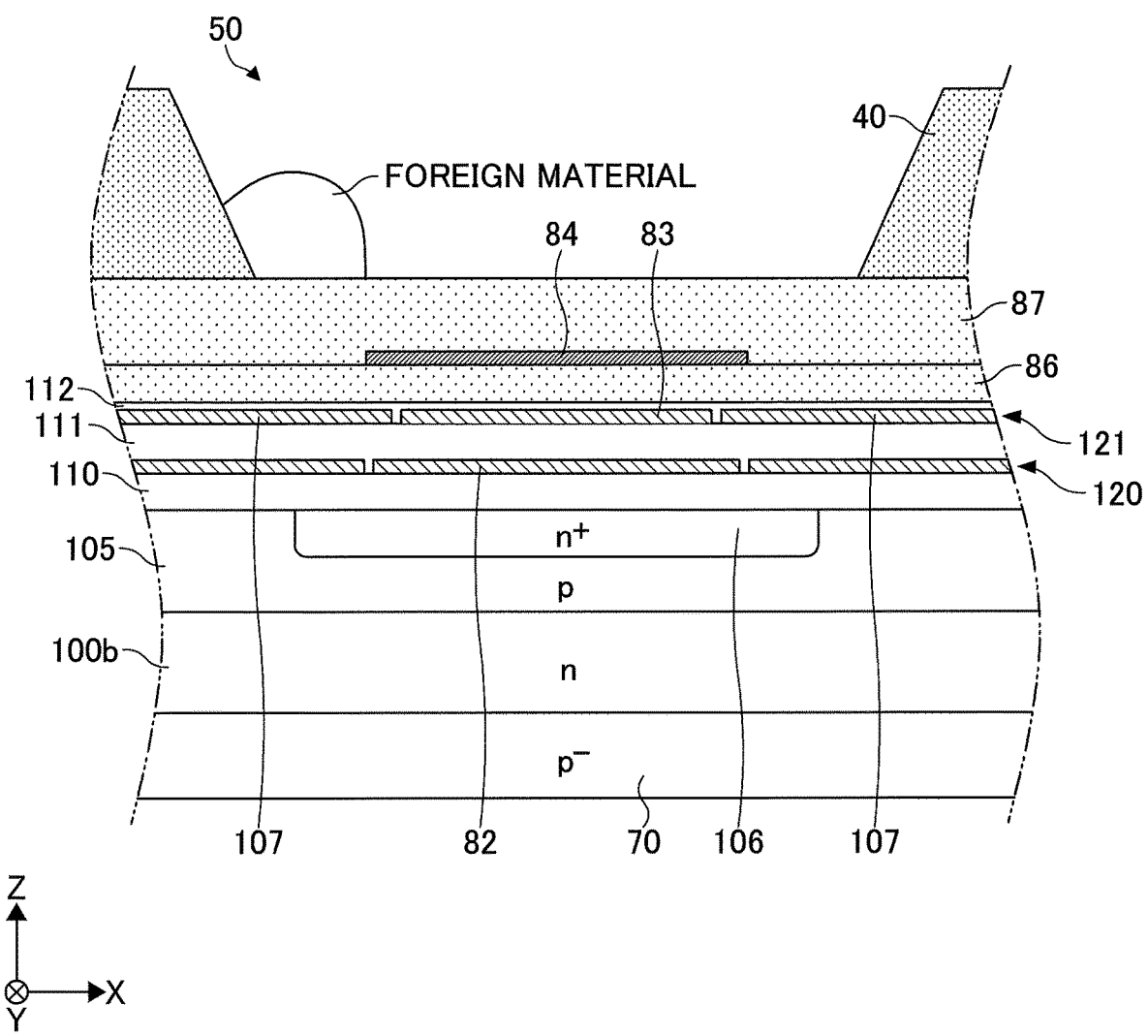
FIG. 13 is a schematic cross-sectional view of a structure taken through line A-A of FIG. 12.

FIG. 13 is a schematic cross-sectional view of a structure taken through line A-A of FIG. 12. As illustrated in FIG. 13, the lower electrode 83, functioning as the capacitance detecting electrode, is provided above the reference electrode 82, and is not provided near the p-type semiconductor substrate 70, thereby reducing parasitic capacitance between the lower electrode 83 and the p-type semiconductor substrate 70.

Further, the upper electrode 84 is located above the lower electrode 83, and the ground wiring 107 is formed adjacent to and around the lower electrode 83. These shielding effects allow an electric field to be confined. Thus, as illustrated in FIG. 13, even if a foreign material such as a water drop, which has a high relative dielectric constant and may cause the electrostatic capacitance to change, adheres inside an opening 50, the electric field is shielded by the ground wiring 107 and effects on the lower electrode 83 can be thus reduced.

Further, by making the area of the lower electrode 83 smaller than the area of the reference electrode 82 and the area of the upper electrode 84, the effect of confining the electric field can be improved.

Further, the lower electrode 83 is used in common between the humidity detecting capacitor 80 and the reference capacitor 81, and the reference electrode 82, the upper electrode 84, and the lower electrode 83 are stacked. As a result, the area of the sensor chip 20 can be reduced, thus reducing the size of the humidity sensor 10.

Further, in FIG. 13, the wiring disposed adjacent to the reference electrode 82 is formed by the first wiring layer 120, and is set to the ground potential.

[Configuration of ASIC Chip]

Next, a configuration of the ASIC chip 30 will be described.

FIG. 14 is a block diagram illustrating the configuration of the ASIC chip 30. As illustrated in FIG. 14, the ASIC chip 30 includes the humidity measuring processor 31, the temperature measuring processor 32, the heating controller 33, and the failure determining unit 34.

As will be described below in detail, the humidity measuring processor 31 measures relative humidity by applying a first drive signal and a second drive signal, which are in opposite phases, to the first driving terminal T1 and the second driving terminal T2, respectively, and converting electric charge output from the pad 24b as the signal terminal TS into a voltage.

The temperature measuring processor 32 detects the potential of the pad 24e, which functions as the temperature detecting terminal HT, and calculates the temperature corresponding to the detected potential.

The heating controller 33 supplies a current (for example, approximately 10 mA) to the heating unit 23 by applying a predetermined driving voltage to the pad 24f, which functions as the heating terminal HT, so as to generate heat. The heating controller 33 controls the amount of heat by controlling the predetermined driving voltage applied to the pad 24f.

The failure determining unit 34 determines the occurrence of a failure, based on the relative humidity measured by the humidity measuring processor 31 and also the temperature measured by the temperature measuring processor 32. When determining the occurrence of a failure, the failure determining unit 34 outputs, to the heating controller 33, an instruction to start and finish applying heat.

For example, the failure determining unit 34 acquires the measured humidity H1 from the humidity measuring processor 31 and obtains the temperature T1 from the temperature measuring processor 32 in an initial state in which the heating unit 23 does not generate heat. Then, the failure determining unit 34 causes the heating unit 23 to start generating heat, and obtains acquires the measured from the humidity measuring processor 31 and the temperature T2 from the temperature measuring processor 32 after a predetermined period of time has elapsed.

When the temperature increases by heating (T2>T1) and the humidity decreases by heating (H2<H1), the failure determining unit 34 determines that the humidity sensor 10 is functioning normally. In cases other than the above, the failure determining unit 34 determines that the humidity sensor 10 is malfunctioning.

[Configuration of Humidity Measuring Processor]

Next, a configuration of the humidity measuring processor 31 will be described.

Figure 15:
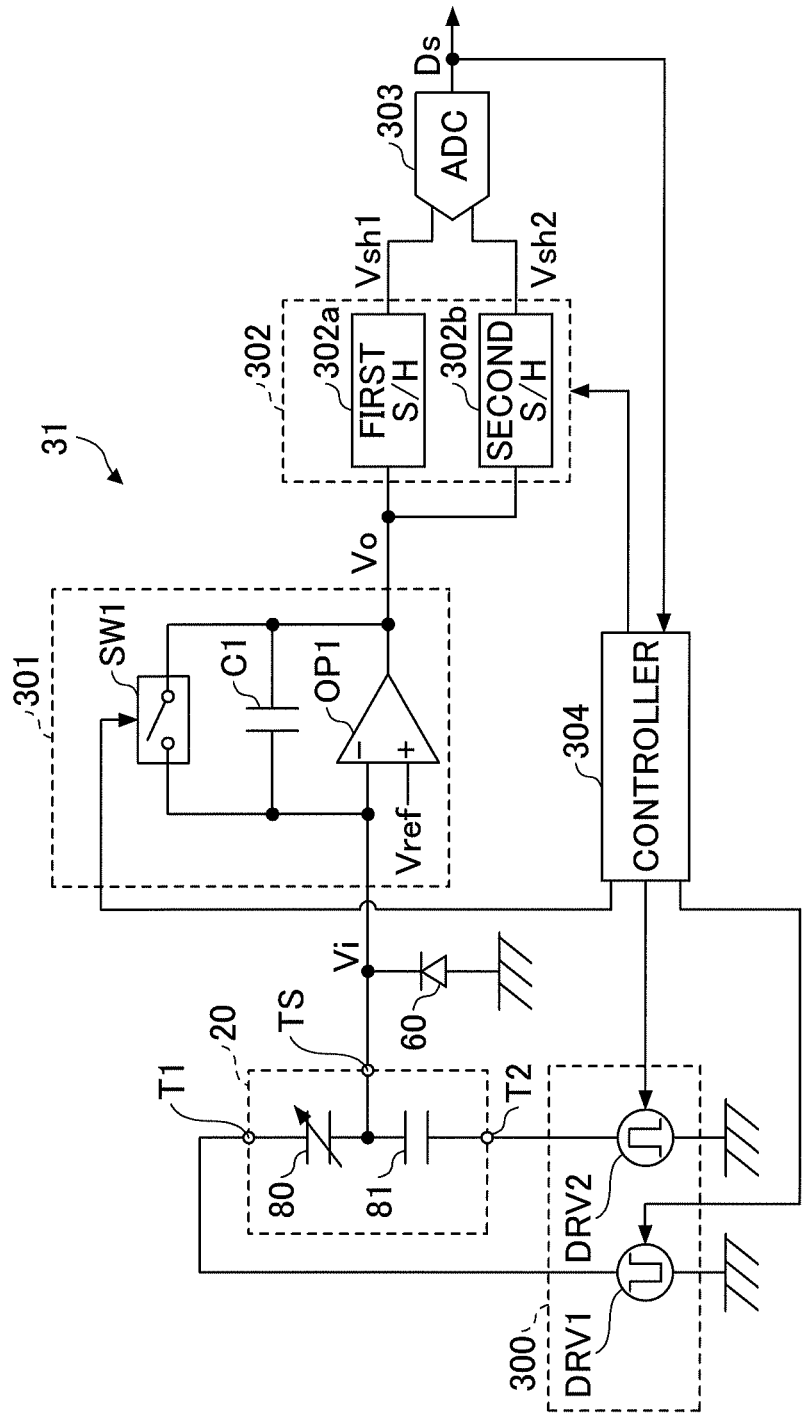
FIG. 15 is a diagram illustrating a configuration of a humidity measuring processor.

FIG. 15 is a diagram illustrating the configuration of the humidity measuring processor 31. As illustrated in FIG. 15, the humidity measuring processor 31 includes a drive unit 300, the charge amplifier 301, a sample and hold circuit 302, an analog-to-digital converter (ADC) 303, and a controller 304. FIG. 15 illustrates the ESD protection circuit 60 connected to the pad 24b, functioning as the signal terminal TS, of the sensor chip 20.

The drive unit 300 includes a first drive circuit DRV1 and a second drive circuit DRV2. The charge amplifier 301 serves as a switched capacitor type charge-to-voltage converter (CV converter) that includes a capacitor C1, an operational amplifier OP1, and a switch circuit SW1.

The first drive circuit DRV1 applies the first drive signal, which is a square wave alternating current (AC) drive signal, to the first driving terminal T1 of the sensor chip 20, as controlled by the controller 304. The second drive circuit DRV2 applies the second drive signal to the second driving terminal T2 of the sensor chip 20, as controlled by the controller 304. The second drive signal is a square wave AC drive signal, and is in an opposite phase to the first drive signal. If the first drive signal is at a high level, the second drive signal is at a low level. If the first drive signal is at a low level, the second drive signal is at a high level. The high level of the first drive signal and the second drive signal is equal to, for example, the power supply voltage VDD, and the low level is equal to, for example, the ground potential GND.

On end of the capacitor C1 is connected to the signal terminal TS of the sensor chip 20, and the other end of the capacitor C1 is connected to the output of the operational amplifier OP1.

An inverting input terminal of the operational amplifier OP1 is connected to the signal terminal TS, and a noninverting input terminal of the operational amplifier OP1 is connected to a reference voltage Vref. The reference voltage Vref may be an intermediate value between the high level and the low level of the first and second drive signals.

Because the voltage gain of the operational amplifier OP1 is very large, the voltage of the signal terminal TS is approximately equal to the reference voltage Vref. In addition, the input impedance of the inverting input terminal of the operational amplifier OP1 is very high. Thus, almost no current flows into the inverting input terminal. The operational amplifier OP1 amplifies a difference between the voltage of the signal terminal TS and the reference voltage Vref, and outputs the amplified voltage Vo.

The switch circuit SW1 is a circuit that discharges electric charge stored in the capacitor C1, and is connected in parallel to the capacitor C1. The switch circuit SW1 is turned on or off, as controlled by the controller 304.

The sample and hold circuit 302 includes a first sample and hold circuit (first S/H) 302a and a second sample and hold circuit (second S/H) 302b. The first S/H 302a and the second S/H 302b are connected in parallel between the drive unit 300 and the ADC 303. Each of the first S/H 302a and the second S/H 302b selectively samples the voltage Vo output from the drive unit 300, and outputs the held voltage, as controlled by the controller 304.

The ADC 303 is a differential-input-type AD converter. One of two input terminals is connected to an output terminal of the first S/H 302a and the other is connected to an output terminal of the second S/H 302b. The ADC 303 converts a differential value AV between an output voltage Vsh1 of the first S/H 302a and an output voltage Vsh2 of the second S/H 302b into a digital signal Ds, and outputs the digital signal Ds. That is, the ADC 303 functions as a differential processor.

The controller 304 controls the units included in the ASIC chip 30. The controller 304 causes the drive unit 300 to generate the drive signals, the switch circuit SW1 to discharge electric charge stored in the capacitor C1, the sample and hold circuit 302 to sample and hold the voltage, and the ADC 303 to perform AD conversion, based on a predetermined measurement sequence.

[Measurement Sequence]

Next, the measurement sequence will be described.

Figure 16:
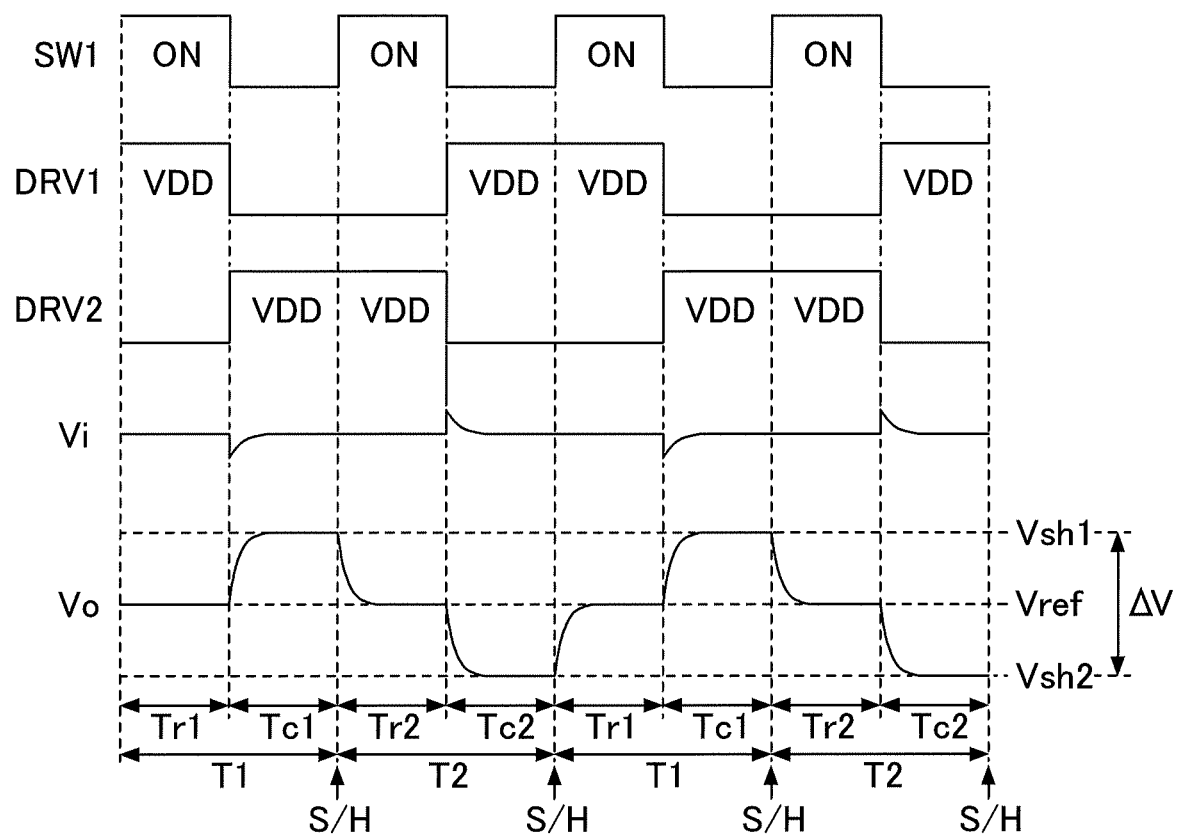
FIG. 16 is a timing chart illustrating a measurement sequence.

FIG. 16 is a timing chart illustrating the measurement sequence. In the measurement sequence, the controller 304 controls the units to repeat a first period of time T1 and a second period of time T2. The first period of time T includes a first reset period of time Tr1 and a first electric charge transfer period of time Tc1. The second period of time T2 includes a second reset period of time Tr2 and a second electric charge transfer period of time Tc2.

Each of the first reset period of time Tr1 and the second reset period of time Tr2 is a period of time in which the switch circuit SW1 is turned on and electric charge stored in the capacitor C1 is discharged. Each of the first electric charge transfer period of time Tc1 and the second electric charge transfer period of time Tc2 is a period of time in which the switch circuit SW1 is turned off, the capacitor C1 is ready to be charged, and electric charge, output from the signal terminal TS of the sensor chip 20, is transferred to the capacitor C1.

In the first reset period of time Tr1, the first drive signal is at the high level, and the second drive signal is at the low level. In the first electric charge transfer period of time Tc1, the first drive signal is at the low level, and the second drive signal is at the high level. In the second electric charge transfer period of time Tc2, the first drive signal is at the high level, and the second drive signal is at the low level. Therefore, the voltage of each of the first drive signal and the second drive signal is inverted between a first period of time and a second period of time. Namely, the phase of the voltage in the first period of time becomes opposite to the voltage in the second period of time.

Accordingly, the output voltage Vo from the operational amplifier OP1 is inverted between the first electric charge transfer period of time Tc1 and the second electric charge transfer period of time Tc2. The output voltage Vo in the first electric charge transfer period of time Tc1 (a first output voltage) is sampled and held by the first S/H 302a. The output voltage Vo in the second electric charge transfer period of time Tc2 (a second output voltage) is sampled and held by the second S/H 302b. Note that "voltage is inverted" means that voltage is inverted with respect to the reference voltage Vref.

In the following, the periods of time will be described in detail. First, in the first reset period of time Tr1, by turning the switch circuit SW1 on, the capacitor C1 is discharged and the operational amplifier OP1 produces a virtual short circuit. At this time, the high level (VDD) of the first drive signal is applied to the first driving terminal T1, and the low level (GND) of the second drive signal is applied to the second driving terminal T2. Accordingly, based on the reference voltage Vre, electric charge is stored in the humidity detecting capacitor 80 and in the reference capacitor 81 of the sensor chip 20. The sum of electric charge Q1 is expressed by the following formula (1).

$$Q1 = -Cs \cdot (VDD - Vref) + Cr \cdot Vref \tag{1}$$

Cs represents the electrostatic capacitance of the humidity detecting capacitor 80 and Cr represents the electrostatic capacitance of the reference capacitor 81.

In the first reset period of time Tr1, because the switch circuit SW1 is turned on, electric charge Q2 stored the capacitor C1 is 0.

Next, in the first electric charge transfer period of time Tc1, the switch circuit SW1 is turned off, and the first drive signal is changed to the low level (GND) and the second drive signal is changed to the high level (VDD). Because the switch circuit SW1 is turned off, and the inverting input terminal of the operational amplifier OP1 is in a high impedance (HiZ) state, the total electric charge in the humidity detecting capacitor 80, the reference capacitor 81, and the capacitor C1 is maintained constant based on the charge conservation principle.

In accordance with changes in the voltages of the first drive signal and the second drive signal, a voltage Vi of the inverting input terminal of the operational amplifier OP1 changes. Thereafter, the output voltage Vo increases until differential input voltages are balanced by feedback from the operational amplifier OP1.

The total electric charge Q3 of the humidity detecting capacitor 80 and the reference capacitor 81 is expressed by the following formula (2).

$$Q3 = -Cr \cdot (VDD - Vref) + Cs \cdot Vref \tag{2}$$

Further, in the first electric charge transfer period of time Tc1, electric charge Q4 stored in the capacitor C1 is expressed by the following formula (3).

$$Q4 = C1 \cdot (Vref - Vo) \tag{3}$$

Based on the charge conservation principle, the relationship of "Q1+Q2=Q3+Q4" is established. Accordingly, the output voltage Vo in the first electric charge transfer period of time Tc1 is expressed by the following formula (4).

$$Vo = VDD \cdot (Cs - Cr)/C1 + Vref \tag{4}$$

At the end of the first electric charge transfer period of time Tc1, at which the output voltage Vo is sufficiently increased, the first S/H 302a samples the signal, and the output voltage Vo expressed by the formula (4) is held by the first S/H 302a.

Next, the second reset period of time Tr2 is similar to the first reset period of time Tr1. However, the voltage of each the first drive signal and the second drive signal is inverted between the first reset period of time Tr1 and the second reset period of time Tr2. Therefore, the total electric charge Q1' of the humidity detecting capacitor 80 and the reference capacitor 81 in the second reset period of time Tr2 is expressed by the following formula (5).

$$Q1'=-Cr \cdot (VDD-Vref)+Cs \cdot Vref \quad (5)$$

Electric charge Q2' stored in the capacitor C1 is 0.

Similarly, the voltage of each the first drive signal and the second drive signal is inverted between the first electric charge transfer period of time Tc1 and the second electric charge transfer period of time Tc2. Therefore, the total electric charge Q3' of the humidity detecting capacitor 80 and the reference capacitor 81 in the second electric charge transfer period of time Tc2 is expressed by the following formula (6).

$$Q3'=-Cs \cdot (VDD-Vref)+Cr \cdot Vref \quad (6)$$

Electric charge Q4' stored in the capacitor C1 in the second electric charge transfer period of time Tc2 is expressed by the formula (3) above.

Based on the charge conservation principle, the relationship of "Q1'+Q2'=Q3'+Q4'" is established. Accordingly, the output voltage Vo in the second electric charge transfer period of time Tc2 is expressed by the following formula (7).

$$Vo=-VDD \cdot (Cs-Cr)/C1+Vref \quad (7)$$

At the end of the second electric charge transfer period of time Tc2 at which the output voltage Vo is sufficiently increased, the second S/H 302b takes a sample of the signal, and the output voltage Vo expressed by the formula (7) is held by the second S/H 302b.

Each of the first S/H 302a and the second S/H 302b maintains the voltage currently held. Therefore, the output voltage Vsh1 that matches the output voltage Vo expressed by the formula (4) and the output voltage Vsh2 that matches the output voltage Vo expressed by the formula (7) are input into the ADC 303.

Accordingly, the differential value ΔV generated by the ADC 303, functioning as the differential processor, is expressed by the following formula (8).

$$\Delta V=2 \cdot VDD \cdot (Cs-Cr)/C1 \quad (8)$$

As described above, the voltage of each of the first drive signal and the second drive signal is inverted between a first period of time and a corresponding second period of time, thus allowing the amplitude of the signals to be doubled.

[Effect of Offsetting Leakage Current]

Figure 17:
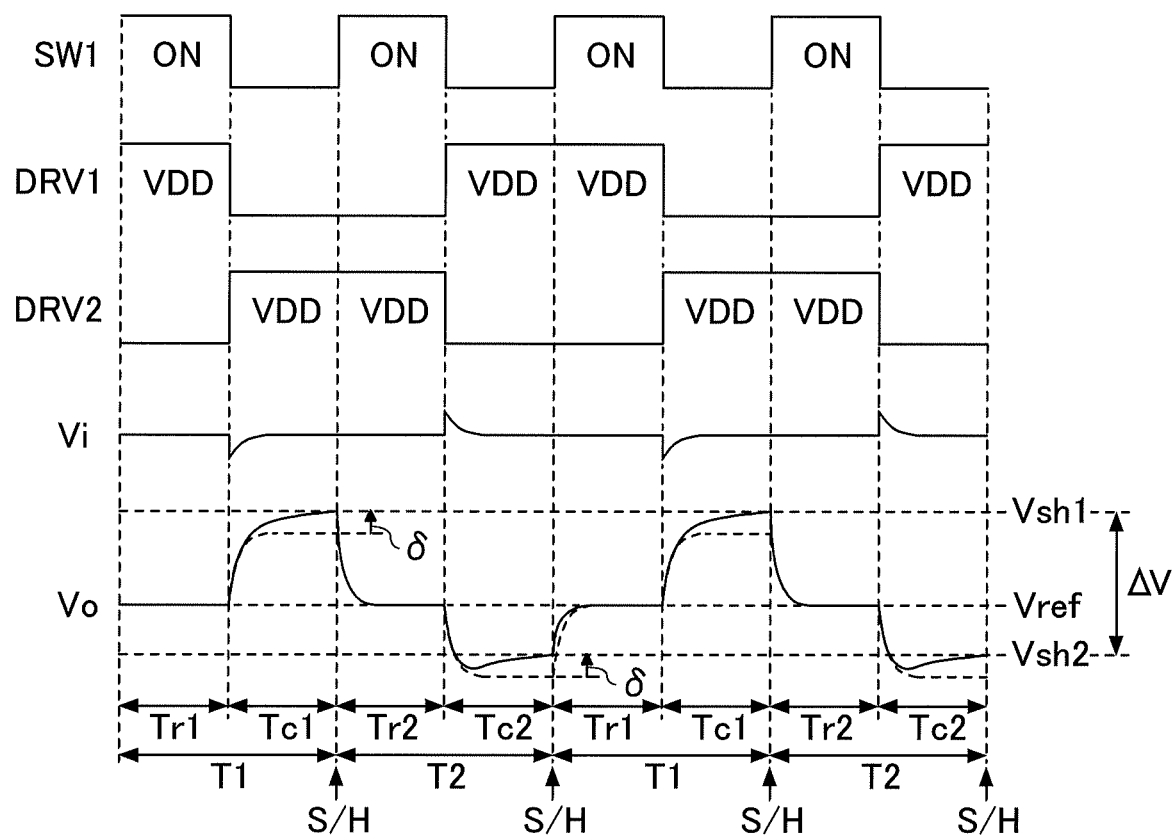
FIG. 17 is a diagram illustrating an effect of offsetting a leakage current.

FIG. 17 is a diagram illustrating the effect of offsetting a leakage current. In the present embodiment, because the ESD protection circuit 60 is connected to the signal terminal TS of the sensor chip 20, a reverse voltage may be applied to a p-n junction of the ESD protection circuit 60, thereby generating a reverse current (leakage current). Further, a reverse voltage may be applied to a p-n junction of the switch circuit SW1 of the operational amplifier OP1 or a p-n junction of a switch circuit (not illustrated) connected to the signal terminal TS and a reverse current (leakage current) may be generated.

Such a leakage current flows, for example, from the output terminal of the charge amplifier 301, the capacitor C1, the input terminal of the charge amplifier 301, and the ESD protection circuit 60 into the ground in the first electric charge transfer period of time Tc1 or in the second electric charge transfer period of time Tc2 in which the switch circuit SW1 is turned off. The leakage current flowing through the switch circuit SW1 causes the output voltage Vo to vary. A variation δ of the output voltage Vo is expressed by the following formula (9).

$$\Delta=I \cdot t/C1 \quad (9)$$

In the above formula, I represents the magnitude of the leakage current, and t represents the length of the first electric charge transfer period of time Tc1 or the second electric charge transfer period of time Tc2.

If the leakage current flows from the input terminal of the charge amplifier 301 into the ground via the above-described path, the variation δ becomes positive, and the output voltage Vo is increased. Conversely, if the leakage current flows from a high voltage terminal (such as VDD) into the input terminal of the charge amplifier 301, the variation δ would become negative, and the output voltage Vo would be decreased.

Regardless of the first electric charge transfer period of time Tc1 or the second electric charge transfer period of time Tc2, a leakage current passes through the same path. Therefore, whether the variation δ becomes positive or negative does not depend on whether the period of time is the first electric charge transfer period of time Tc1 or the second electric charge transfer period of time Tc2.

Accordingly, as illustrated in FIG. 17, if a leakage current is generated, the variation δ has the same (negative or positive) polarity in the first electric charge transfer period of time Tc and in the second electric charge transfer period of time Tc2. Thus, the variation δ is offset by a differential process performed by the ADC 303, and output voltage error of the charge amplifier 301 due to the leakage current can be suppressed.

In the measurement sequences illustrated in FIG. 16 and FIG. 17, the high level of the voltage of each of the first drive signal and the second drive signal may be set to the low level, and the low level may be set to the high level.

[Effect of Reducing Power Consumption]

Next, the reduction of power consumption by utilizing the stacked structure of the electrodes illustrated in FIG. 9 and FIG. 13 will be described.

Figure 18:
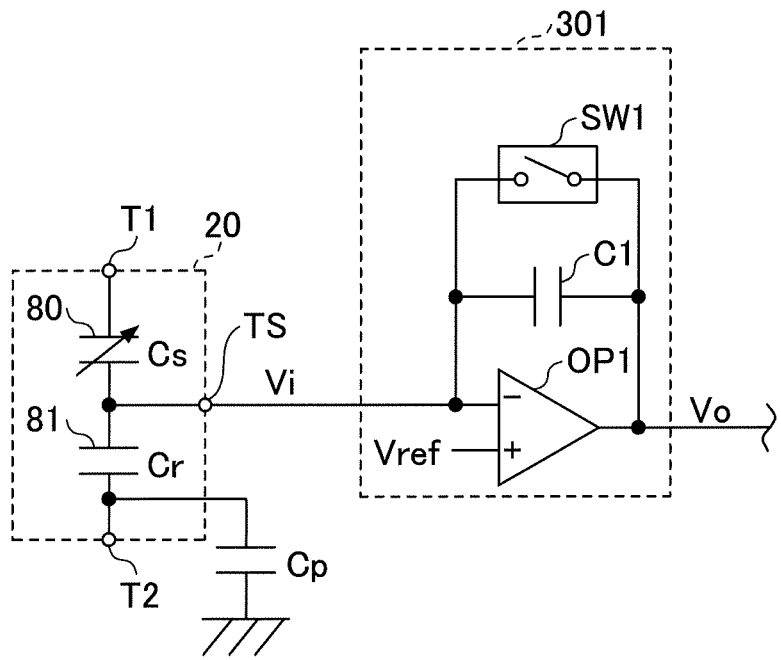
FIG. 18 is an equivalent circuit with parasitic capacitance.

FIG. 18 is an equivalent circuit with parasitic capacitance. As illustrated in FIG. 9 and FIG. 13, in the present embodiment, the reference electrode 82 is located adjacent to the p-type semiconductor substrate 70. As a result, parasitic capacitance Cp is generated between the reference electrode 82 and the p-type semiconductor substrate 70. As illustrated in FIG. 18, the parasitic capacitance Cp is added between the reference capacitor 81 and the second driving terminal T2.

Figure 19:
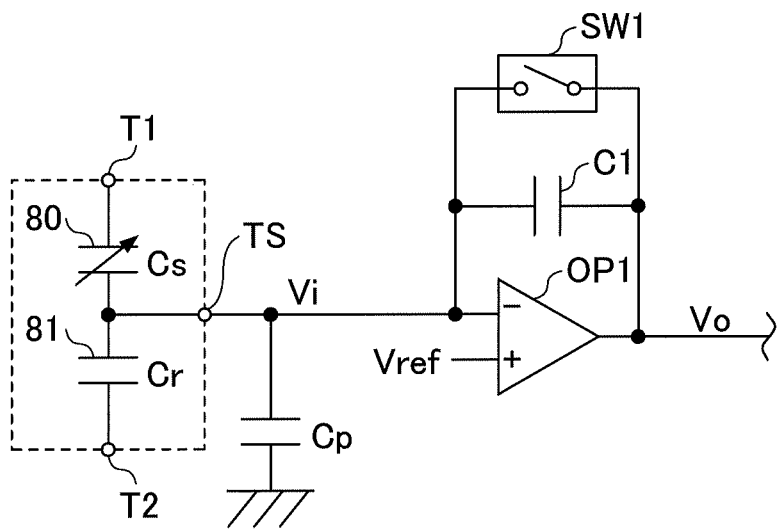
FIG. 19 is an equivalent circuit of a conventional electrode structure.

FIG. 19 is an equivalent circuit of a conventional electrode structure as a comparative example of the present embodiment. For example, as illustrated in FIG. 4 of Patent Document 1, the lower electrode, which functions as a capacitance detecting electrode, is formed adjacent to the substrate. As a result, parasitic capacitance Cp is generated between the lower electrode and the substrate. In the comparative example illustrated in FIG. 19, the parasitic capacitance Cp is added to a signal terminal TS.

In the present embodiment, the parasitic capacitance Cp generated between the electrode and the substrate is not added to the signal terminal TS, but is added to the reference capacitor 81. Accordingly, the drive load on the input terminal of the charge amplifier 301 connected to the signal terminal TS is reduced, thereby reducing power consumption.

[Variation of Humidity Measuring Processor]

Next, a variation of the humidity measuring processor will be described.

Figure 20:
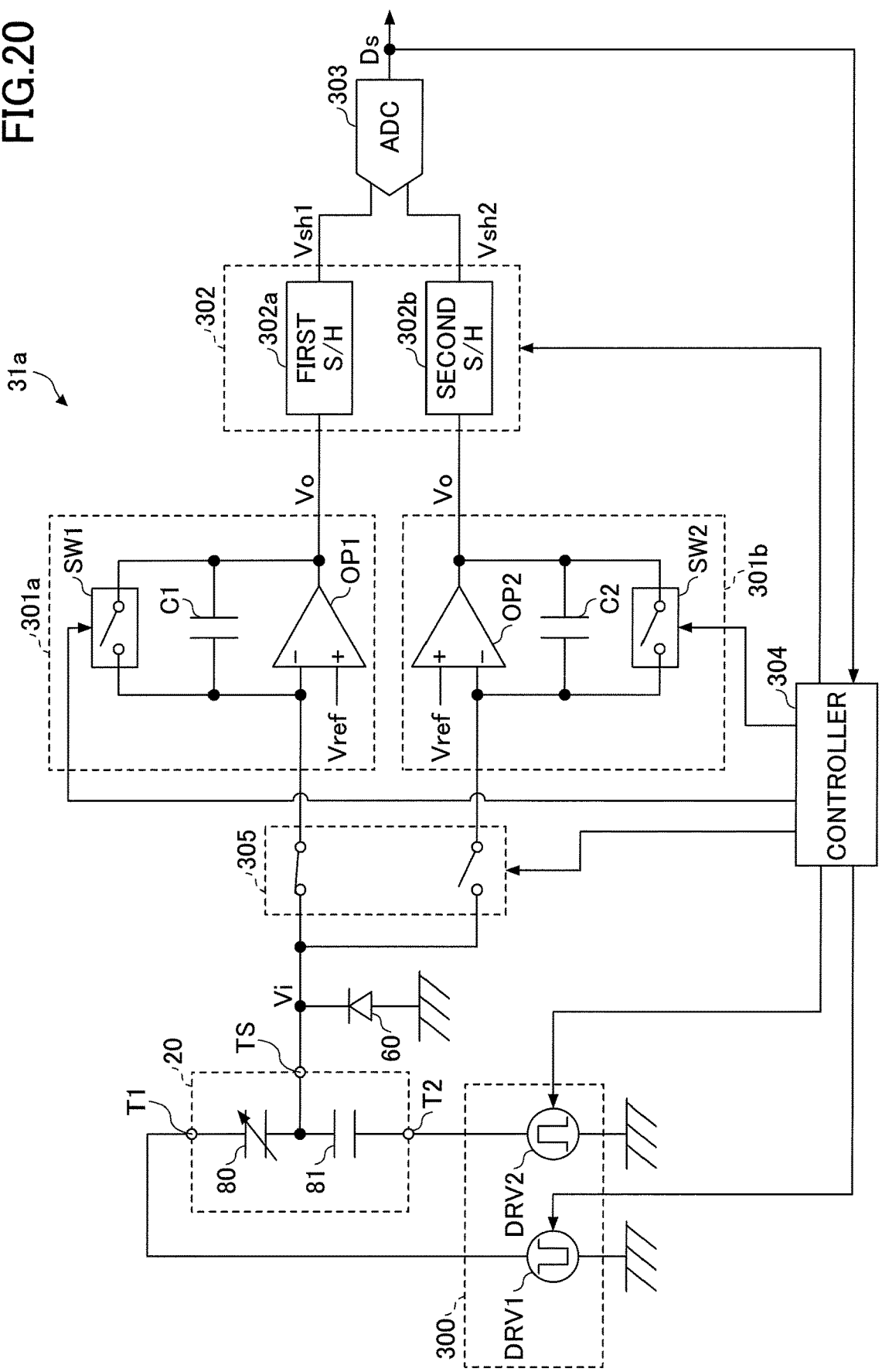
FIG. 20 is a diagram illustrating a configuration of a humidity measuring processor according to a variation.

FIG. 20 is a diagram illustrating a configuration of a humidity measuring processor 31a. As illustrated in FIG. 20, the humidity measuring processor 31a according to the variation differs from the humidity measuring processor 31 according to the above-described embodiment in that a first charge amplifier 301a, a second charge amplifier 301b, and a demultiplexer (DEMUX) 305 are included.

The configurations of the first charge amplifier 301a and the second charge amplifier 301b are the same as the configuration of the charge amplifier 301 of the above-described embodiment.

The first S/H 302a is connected to the output terminal of the first charge amplifier 301a, and the second S/H 302b is connected to the output terminal of the second charge amplifier 301b. The DEMUX 305 is connected to each of the input terminals of the first charge amplifier 301a and the second charge amplifier 301b. The DEMUX 305 is connected to the signal terminal TS of the sensor chip 20.

As controlled by the controller 304, the DEMUX 305 selectively connects the first charge amplifier 301a and the second charge amplifier 301b to the signal terminal TS. More specifically, the DEMUX 305 connects the first charge amplifier 301a to the signal terminal TS in the above-described first period of time T1, and connects the second charge amplifier 301b to the signal terminal TS in the above-described second period of time T2.

Accordingly, in the humidity measuring processor 31a according to the variation, CV conversion is performed by the first charge amplifier 301a and sampling and holding is performed by the first S/H 302a in the first period of time T1, and in the second period of time T2, CV conversion is performed by the second charge amplifier 301b and sampling and holding is performed by the second S/H 302b.

Other configurations and operations of the humidity measuring processor 31a are the same as those of the humidity measuring processor 31 according to the above-described embodiment.

[Variation of Shielding Layer]

Next, a variation of the shielding layer will be described.

In FIG. 12, the ground wiring 107 is formed adjacent to and around the lower electrode 83, thereby allowing the ground wiring 107 to serve as the shielding layer. In the following variation, shielding layer(s) are individually provided around the lower electrode 83.

Figure 21:
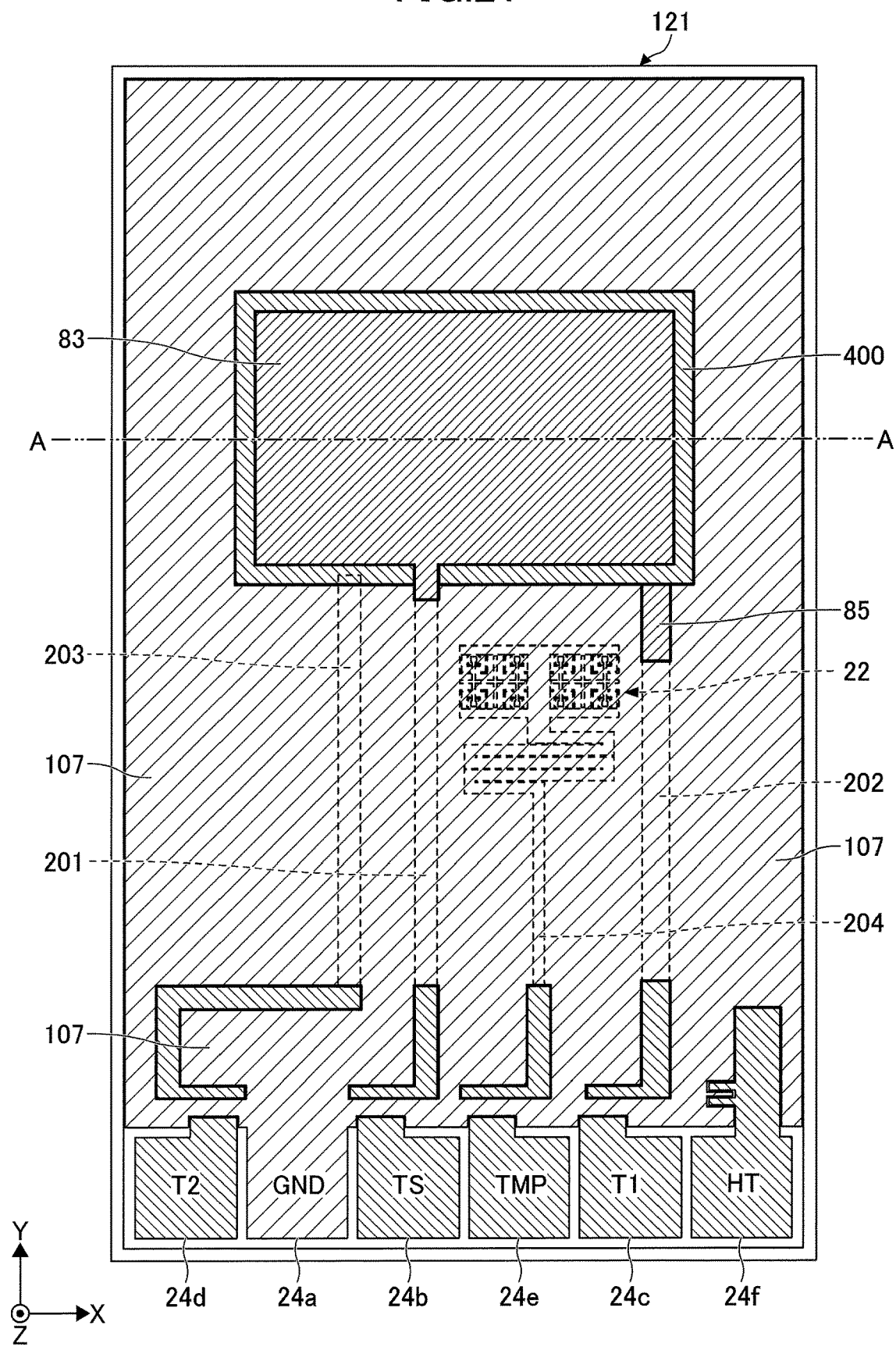
FIG. 21 is a plan view of a shielding layer according to a first variation.

FIG. 21 is a plan view of a shielding layer according to a first variation. As illustrated in FIG. 21, in the first variation, a shielding layer 400 is formed so as to surround the lower electrode 83. The potential of the shielding layer 400 is preferably fixed (for example, fixed at the power supply voltage VDD or the ground potential GND). Further, the potential of the shielding layer 400 may be fixed at the first drive signal or the second drive signal.

Figure 22:
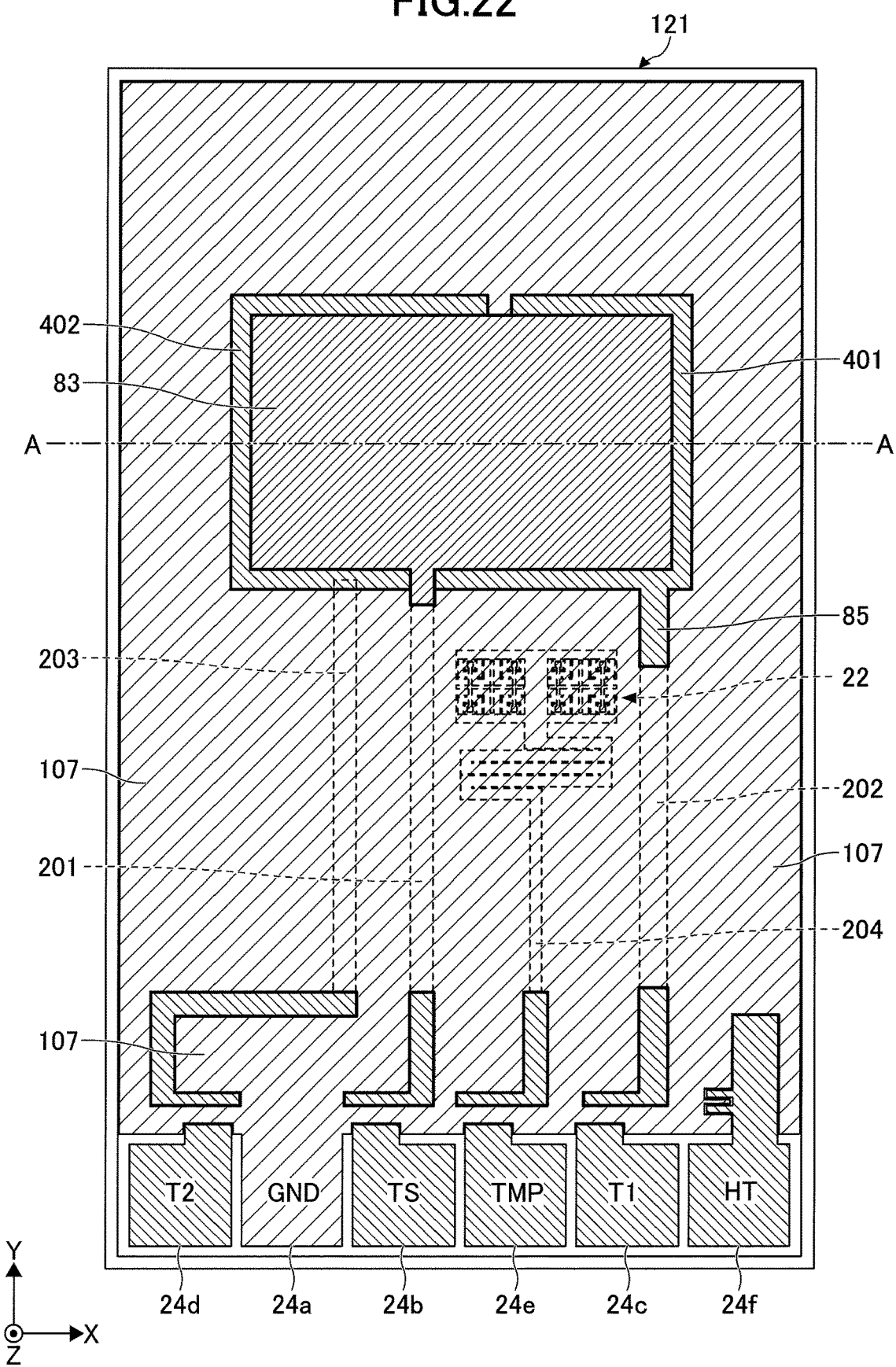
FIG. 22 is a plan view of a shielding layer according to a second variation.

FIG. 22 is a plan view of a shielding layer according to a second variation. As illustrated in FIG. 22, in the second variation, a first shielding layer 401 and a second shielding layer 402 are formed so as to surround the lower electrode 83.

The first shielding layer 401 surrounds a part (approximately half) of the lower electrode 83, and the second shielding layer 402 surrounds the other part (approximately half) of the lower electrode 83. The first shielding layer 401 and the second shielding layer 402 are approximately equal in length, width, thickness, and distance from the lower electrode 83. Thus, parasitic capacitance generated between the first shielding layer 401 and the lower electrode 83 is approximately equal to parasitic capacitance generated between the second shielding layer 402 and the lower electrode 83.

The first shielding layer 401 is connected to the signal line 202, and the first drive signal is applied to the first shielding layer 401. The second shielding layer 402 is connected to the signal line 203, and second drive signal is applied to the second shielding layer 402.

Applying the first drive signal and the second drive signal to the first shielding layer 401 and the second shielding layer 402, respectively, may cause deviations in the absolute value of the electrostatic capacitance of the humidity detecting capacitor 80 and the absolute value of the electrostatic capacitance of the reference capacitor 81. However, such deviations can be estimated, and thus can be eliminated by correcting the output voltage Vo.

Note that the number of shielding layers that surround the lower electrode 83 may be three or more.

[Other Variations]

Other variations will be described below.

In the above-described embodiment, the ESD protection circuit is configured by the NMOS transistor; however, the ESD protection circuit may alternatively be configured by a P-channel MOS transistor (PMOS transistor).

Further, in the above-described embodiment, the substrate of the sensor chip 20 is the p-type semiconductor substrate 70; however, an n-type semiconductor substrate may be employed.

Further, in the above-described embodiment, the humidity sensor 10 has the stacked structure in which the sensor chip 20 is stacked on the ASIC chip 30. However, the present invention may also be applied to humidity sensors that have a structure different from the stacked structure.

Further, in the above-described embodiment, the humidity detecting capacitor 80 and the reference capacitor 81 are provided. However, the reference capacitor 81 is not required to be provided. In this case, the second drive circuit DRV2 that outputs the second drive signal is not necessary. Output voltage error of the charge amplifier 301 caused by a leakage current can be suppressed in this case as well, in accordance with the measurement sequence illustrated in FIG. 17.

Further, in the above-described embodiment, the humidity detecting unit 21 serves as a capacitance-change-type humidity sensor. However, the humidity detecting unit 21 may serve as a resistance-change-type humidity sensor such as a piezo-resistance humidity sensor that detects changes in resistance of the humidity sensing film based on adsorption and desorption of water molecules.

Further, in the above-described embodiment, the humidity sensor 10 that detects humidity has been described as the sensor. However, the present invention may be applied to any sensor that detects a physical quantity other than humidity. Namely, instead of the humidity detecting unit 21, a detecting unit that outputs a signal in accordance with a physical quantity other than humidity may be employed. More specifically, instead of the humidity sensing film 86, a physical quantity detecting film whose dielectric constant changes in accordance with a physical quantity other than humidity may be employed.

Further, in the present specification, the positional relationship between two elements, represented by terms such as "cover" and "on", includes both cases in which a first element is indirectly disposed on the surface of a second element via another element and in which the first element is directly disposed on the second element.

Further, the present invention is not limited to these embodiments. Variations and modifications may be made to the described subject matter without departing from the scope of the present invention.

What is claimed is:

1. A sensor comprising:
a substrate;
an insulating film;
a physical quantity detecting film;
a reference electrode provided above the substrate;
a lower electrode provided above the reference electrode, the reference electrode being provided on an opposite side of the insulating film from the lower electrode; and
an upper electrode provided above the lower electrode, the lower electrode being provided on an opposite side of the physical quantity detecting film from the upper electrode, wherein
the area of the lower electrode is smaller than the area of the reference electrode and the area of the upper electrode, and
the upper electrode and the lower electrode form a parallel-plate-type detection capacitor, and the lower electrode and the reference electrode form a parallel-plate-type reference capacitor.

2. The sensor according to claim 1, wherein a shielding layer is disposed to surround the lower electrode.

3. The sensor according to claim 2, further comprising two or more shielding layers.

4. The sensor according to claim 3, wherein
the two or more shielding layers include a first shielding layer disposed to surround a part of the lower electrode and a second shielding layer disposed to surround another part of the lower electrode, and
respective drive signals are applied to the first shielding layer and the second shielding layer, the drive signals being in opposite phases.

5. The sensor according to claim 2, wherein
the shielding layer covers signal lines, the signal lines being respectively connected to the reference electrode, the lower electrode, and the upper electrode.

6. The sensor according to claim 5, wherein
electrostatic discharge protection circuits are coupled to the respective signal lines.

7. The sensor according to claim 6, wherein
the substrate is a semiconductor substrate, and each of the electrostatic discharge protection circuits includes a metal-oxide-semiconductor transistor.

8. The sensor according to claim 3, wherein
the two or more shielding layers are wiring layers that are produced by a same production process as the lower electrode.

9. The sensor according to claim 1, further comprising:
a driver configured to apply a first alternate current drive signal to the upper electrode and apply a second alternate current drive signal to the reference electrode, the first alternate current drive signal and the second alternate current drive signal being in opposite phases; and
a charge-to-voltage converter configured to convert an electric charge into a voltage, the electric charge being output from the lower electrode.

10. The sensor according to claim 9, further comprising:
a first semiconductor chip including the detection capacitor and the reference capacitor; and
a second semiconductor chip including the driver and the charge-to-voltage converter.

11. The sensor according to claim 10, wherein
the first semiconductor chip is stacked above the second semiconductor chip.

12. The sensor according to claim 1, wherein
the physical quantity detecting film is a humidity sensing film.

13. The sensor according to claim 12, wherein
the humidity sensing film is formed of a polyimide.

14. The sensor according to claim 1, wherein
the area of the upper electrode includes a plurality of opening areas.

15. A sensor comprising:
a substrate;
an insulating film;
a physical quantity detecting film;
a reference electrode provided above the substrate;
a lower electrode provided above the reference electrode, the reference electrode being provided on an opposite side of the insulating film from the lower electrode; and
an upper electrode provided above the lower electrode, the lower electrode being provided on an opposite side of the physical quantity detecting film from the upper electrode, and
constant potential wiring having a shape extending in a plane parallel to a plane of the insulating film, the constant potential wiring surrounding the lower electrode and serving as a shielding layer of the lower electrode, wherein
the upper electrode and the lower electrode form a parallel-plate-type detection capacitor, and the lower electrode and the reference electrode form a parallel-plate-type reference capacitor.

16. A sensor comprising:
a substrate;
an insulating film;
a physical quantity detecting film;
a reference electrode provided above the substrate;
a lower electrode provided above the reference electrode, the reference electrode being provided on an opposite side of the insulating film from the lower electrode;
an upper electrode provided above the lower electrode, the lower electrode being provided on an opposite side of the physical quantity detecting film from the upper electrode;
a plurality of signal lines, each signal line of the plurality of signal lines being respectively connected to one of the reference electrode, the lower electrode, or the upper electrode;
a shielding layer that covers the signal lines; and
a plurality of electrostatic discharge protection circuits, each electrostatic discharge protection circuit of the plurality of electrostatic discharge protection circuits being respectively coupled to one signal line of the plurality of signal lines, wherein
the upper electrode and the lower electrode form a parallel-plate-type detection capacitor, and the lower electrode and the reference electrode form a parallel-plate-type reference capacitor, and
the substrate is a semiconductor substrate, and each of the electrostatic discharge protection circuits includes a metal-oxide-semiconductor transistor.

* * * * *